United States Patent [19]

Nykerk

[11] Patent Number: 5,883,680
[45] Date of Patent: Mar. 16, 1999

[54] REMOTE CONTROL OF A TELEVISION RECEIVER WITH LOCATOR FEATURE OR THE LIKE

[75] Inventor: Michael Nykerk, Woodland Hills, Calif.

[73] Assignee: Innoventions, Inc., Encino, Calif.

[21] Appl. No.: 577,750

[22] Filed: Dec. 22, 1995

Related U.S. Application Data

[63] Continuation-in-part of Ser. No. 538,406, Oct. 2, 1995, abandoned.

[51] Int. Cl.$^6$ ...................................................... H04N 5/44
[52] U.S. Cl. .............. 348/734; 340/825.72; 340/825.31; 340/825.69
[58] Field of Search ................................... 348/734, 731, 348/7, 10, 12, 926; 340/539, 572, 825.31, 825.34, 825.3, 825.32, 825.69, 825.72, 176; H04N 5/44

[56] References Cited

U.S. PATENT DOCUMENTS

| | | | |
|---|---|---|---|
| 4,802,114 | 1/1989 | Sogame | 364/900 |
| 4,807,052 | 2/1989 | Amano | 358/194 |
| 4,827,440 | 5/1989 | Wathon | 341/23 |
| 4,856,081 | 8/1989 | Smith | 455/151 |
| 4,866,434 | 9/1989 | Keenan | 340/825 |
| 4,899,370 | 2/1990 | Kameo et al. | 379/104 |
| 4,912,463 | 3/1990 | Li | 340/825 |
| 4,959,720 | 9/1990 | Duffield et al. | 358/191.1 |
| 4,959,810 | 9/1990 | Darbee et al. | 364/900 |
| 5,005,084 | 4/1991 | Skinner | 358/194.1 |
| 5,065,235 | 11/1991 | Iijima | 358/86 |
| 5,081,534 | 1/1992 | Geiger et al. | 358/194.1 |
| 5,099,233 | 3/1992 | Keenan | 340/825 |
| 5,123,046 | 6/1992 | Levine | 380/10 |
| 5,204,768 | 4/1993 | Tsakiris et al. | 359/148 |
| 5,226,090 | 7/1993 | Kimura | 381/110 |
| 5,228,077 | 7/1993 | Darbee | 379/102 |
| 5,237,319 | 8/1993 | Hidaka et al. | 340/825 |
| 5,247,580 | 9/1993 | Kimura et al. | 381/43 |
| 5,267,323 | 11/1993 | Kimura | 381/110 |
| 5,329,370 | 7/1994 | Yazolino et al. | 548/734 |
| 5,410,326 | 4/1995 | Goldstein | 348/134 |
| 5,414,426 | 5/1995 | O'Donnell et al. | 341/176 |
| 5,414,761 | 5/1995 | Darbee | 379/102 |
| 5,455,560 | 10/1995 | Owen | 340/539 |
| 5,566,879 | 10/1996 | Longtin | 236/46 R |
| 5,640,195 | 6/1997 | Chida | 348/13 |

OTHER PUBLICATIONS

Operations Manual for "Kid Control, The Channel Selectors Just for Kids!", published by TCI.

*Primary Examiner*—Glenton B. Burgess
*Attorney, Agent, or Firm*—Fitch, Even, Tabin & Flannery

[57] ABSTRACT

A remote control device having, in one embodiment, a keypad including a time-lock key and another key; means for locking the other key for a time period specified by a user in response to a depression of the time-lock key; and a transmitter for transmitting a channel select signal in response to a depression of the other key when the other key is not locked. In a further embodiment the remote control device has a keypad including a key; a processor for generating electrical signals in response to a depression of the key; a transmitter for transmitting a transmit signal in response to the electrical signals; a low frequency detector for detecting low frequency soundwaves; and an audio signal generator for emitting an audio signal in response to the low frequency soundwaves.

18 Claims, 15 Drawing Sheets

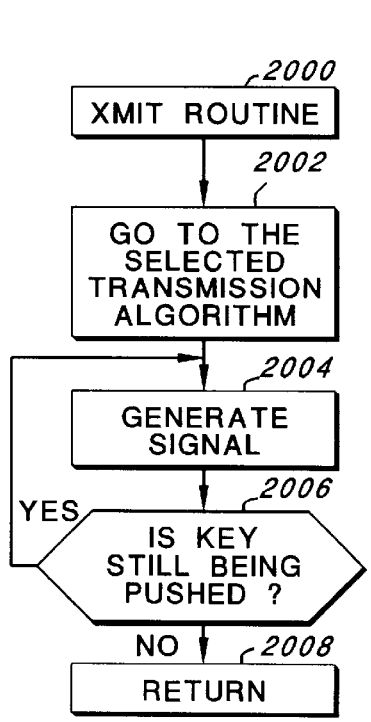
FIG. 7
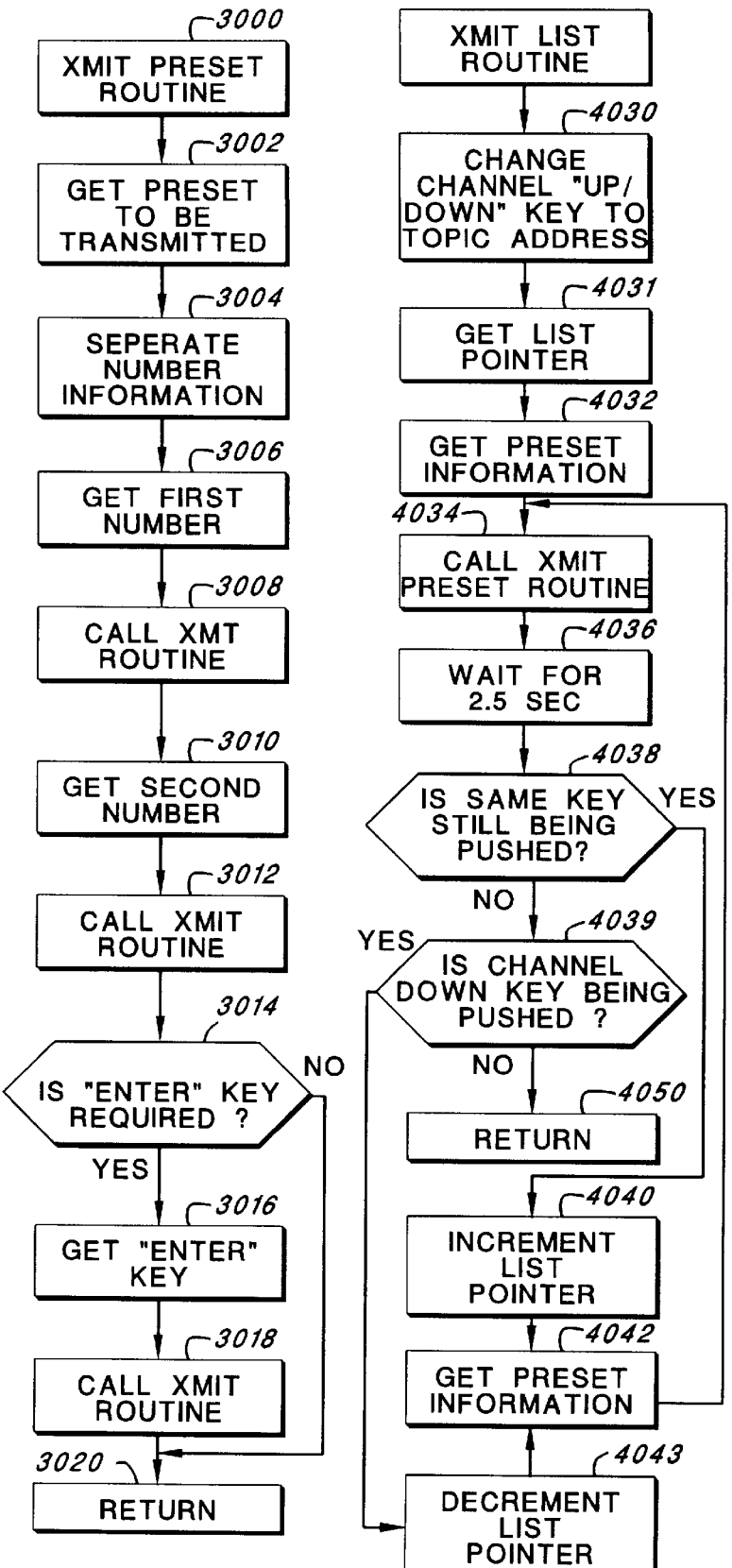
FIG. 8
FIG. 9

REMOTE CONTROL OF A TELEVISION RECEIVER WITH LOCATOR FEATURE OR THE LIKE

This patent document is a Continuation-in-Part of U.S. patent application, Ser. No. 08/538,406, filed Oct. 2, 1995 for REMOTE CONTROL OF A TELEVISION RECEIVER OR THE LIKE, now abandoned, incorporated herein by reference.

A portion of the disclosure of this patent document contains material that is subject to copyright protection. The copyright owner has no objection to the facsimile reproduction by anyone of this patent document or the patent disclosure, as it appears in the United States Patent and Trademark Office patent files or records, but otherwise reserves all copyright rights whatsoever.

BACKGROUND OF THE INVENTION

The present invention relates to remote control of a television receiver or the like.

In the United States there are a number of major broadcasting networks, and a number of cable service networks, each of which distributes television programs throughout, or over large portions of, the country. Many viewers tend to associate television programs with the networks that carry such programs, rather than the particular number assigned to the networks in a particular area. In some areas of the country, the viewer has access to, for example, more than 50 television programs. A common problem, therefore, is that with so many channels available, it is difficult for the viewer to remember which channel number corresponds to which network (and thus to the particular television programs the viewer wishes to view). Thus, tuning by channel number, although widely used, may not be desirable for most viewers.

Furthermore, in a hotel/motel environment, the viewer is typically unfamiliar with local channel numbers. Thus, when the viewer wishes to watch a particular television program on a known network, he/she may have difficulty locating the proper local channel number associated with the desired network and television program.

Compounding this problem is the fact that it is common practice among cable television providers within the United States to remodulate broadcast television signals to different channel numbers than those on which they are normally broadcast. Unfortunately, because, for instance, UHF Channel 29 may be remodulated to occupy the space of, for example, VHF Channel 9, this also has the effect of confusing the viewer. Thus, even if the viewer knew that a particular broadcasting network broadcasts on Channel 29, the viewer may still have difficulty locating the particular broadcast network on his/her cable television system.

A common solution to this problem is to distribute channel conversion charts to cable subscribers so that they can locate the proper cable channel number, given a particular broadcast channel number from a printed television schedule. The channel conversion chart may also indicate the broadcasting network or cable network associated with each of the cable channels provided to the viewer. Unfortunately, such channel conversion charts are easy for the viewer to misplace and require that the user shift his or her attention to the chart whenever he or she wants to locate a network.

Efforts have been made by manufacturers to relate channel numbers to network names. For example, as pointed out by Duffield et al., in U.S. Pat. No. 4,959,720, the DRUNDIG Television Receiver, Model No. CUC-2400, displays a station identification label (previously entered by a user) on a television screen whenever a particular channel is selected. Problematically, the user must still remember which channel number is assigned to the particular broadcasting or cable network desired, because channel selection in the system is made by channel number.

A tune-by-label system is shown in U.S. Pat. No. 4,706,121, issued to Young, however, labels are provided by a broadcaster as part of a television schedule transmitted to an in-home tuner controller. Such a system requires costly and complex circuitry, and furthermore, requires the establishment of infrastructure and bandwidth by broadcasters for the transmission of schedule information.

In U.S. Pat. No. 4,959,720, Duffield et al., describe a tuning system that allows a user to enter labels associated with respective channel numbers, and allows the user to subsequently select the channel numbers by entering the associated text label from a key pad. Unfortunately, Duffield et al. require that the user press multiple buttons in order to select a channel, and therefore, while attempting to simplify the selection of channels, in fact increase the complexity.

Another way in which viewers address the above-described problems is by "channel surfing". Channel surfing involves using forward (i.e., up) and/or reverse (i.e., down) channel selection keys that increment or decrement the channel number each time they are depressed. Thus, a user who is unsure of the channel number on which a particular broadcasting or cable network provides programming can simply depress these keys repeatedly until he/she locates the network or programming in which he/she is interested. Problematically, however, the viewer potentially must "surf" through many, i.e., 50 or more, channel numbers to locate a desired network.

Another popular use of channel surfing is for locating a television program to view. In order to locate a television program in this manner, the viewer simply depresses the forward or reverse channel selection key, briefly views the television program provided on the selected channel number, and makes a decision as to whether or not the television program is a television program in which the viewer is interested. In the event the user is not interested in the television program provided on the selected channel number, he/she again depresses the channel selection key in order to increment or decrement the channel number. This process is repeated, sometimes seemingly indefinitely, until the viewer locates a television program in which he/she is interested.

Unfortunately, in the event the viewer is interested in a particular type of television programming, he/she must "surf" through a multiplicity of networks that do not carry the type of programs in which he/she is interested, in order to evaluate television programs on the few broadcasting and/or cable networks providing the type of programming in which he/she is interested. Thus, heretofore, there has been no way for the viewer to channel "surf" through only those channels or broadcasting and/or cable networks providing the type of television programming in which the viewer is interested.

Another problem associated with television programming today is the broadcasting of "mature subject matter", i.e., violence, sex and/or profanity, on various channels or networks. This problem is of particular concern to parents with young children whom the parents feel should not be exposed to such programming. However, so far, there has been no effective way for the parents to "lock out" those channels which air such programming. In addition, there has been no effective way, so far, for parents to prevent or discourage their children from watching such programming when the parents are not at home, or for some other reason, cannot monitor what their children are watching.

Another familiar problem associated with remote control devices is their tendency to be misplaced. Thus far, there is no remote control device which effectively and conveniently guides the user to its location.

The present invention advantageously addresses the above and other needs.

SUMMARY OF THE INVENTION

The present invention advantageously addresses the needs above as well as other needs by providing a remote control device and method for use with a television receiver or the like.

In one embodiment, the present invention can be characterized as a remote control for controlling an electronic device. In such embodiment, the remote control employs a keypad including a channel group key; a memory for storing a first channel of a channel group, and for storing a second channel of the channel group; a processor for retrieving the first channel of the channel group from the memory in response to a first actuation of the channel group key, and for retrieving the second channel of the channel group from the memory in response to a second actuation of the channel group key; and a transmitter for transmitting a first channel select signal indicative of the first channel of the channel group in response to the retrieval of the first channel of the channel group from the memory and for transmitting a second channel select signal indicative of the second channel of the channel group in response to the retrieval of the second channel of the channel group from the memory.

In another embodiment, the present invention can be characterized as a remote control employing a keypad including a network selection key having a preprinted textual title indicative of a television network; a memory for storing a channel number associated with the network selection key; a processor for retrieving the channel number from the memory in response to an actuation of the network selection key; and a transmitter for transmitting a channel select signal indicative of the channel number in response to the retrieval of the channel number from the memory.

A further embodiment of the invention can be characterized as a remote control having a keypad including a key; a processor including means for generating electrical signals in response to a depression of the key; a transmitter for transmitting a transmit signal in response to the electrical signals; a battery power supply; a low power circuit for detecting whether a voltage supplied by the battery power supply is below a prescribed threshold; and means, coupled to the low power circuit, for signaling a user that the voltage supplied has fallen below the prescribed threshold.

The present invention, in another embodiment, can be characterized as a remote control employing a keypad including a lock key and another key; means for locking the other key in response to a depression of the lock key; and a transmitter for transmitting a channel select signal in response to a depression of the other key only when the other key is not locked.

In another embodiment, the present invention can be characterized as a remote control device having a keypad including a time-lock key and another key; means for locking the other key for a prescribed time period in response to a depression of the time-lock key and a transmitter for transmitting a channel select signal in response to a depression of the other key in the event the other key is not locked.

A further embodiment of the present invention can be characterized as a remote control device having a keypad including a key; a processor, coupled to the keypad, for generating electrical signals in response to a depression of the key; a transmitter, coupled to the processor, for transmitting a transmit signal in response to the electrical signals; a frequency detector for detecting a prescribed frequency band of soundwaves; and an audio signal generator, coupled to the frequency detector, for emitting an audio signal in response to the frequency detector detecting the soundwaves.

BRIEF DESCRIPTION OF THE DRAWINGS

The above and other aspects, features and advantages of the present invention will be more apparent from the following more particular description thereof, presented in conjunction with the following drawings wherein:

FIG. 7 is a flow diagram showing the steps traversed in a transmit routine that is called by the control program of FIG. 6 and by a transmit preset routine of FIG. 8;

FIG. 8 is a flow diagram showing the steps traversed in the transmit preset routine that is called by the control program of FIG. 6 and by a transmit list routine of FIG. 9;

FIG. 9 is a flow diagram showing the steps traversed in the transmit list routine that is called by the control program of FIG. 6;

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1A:
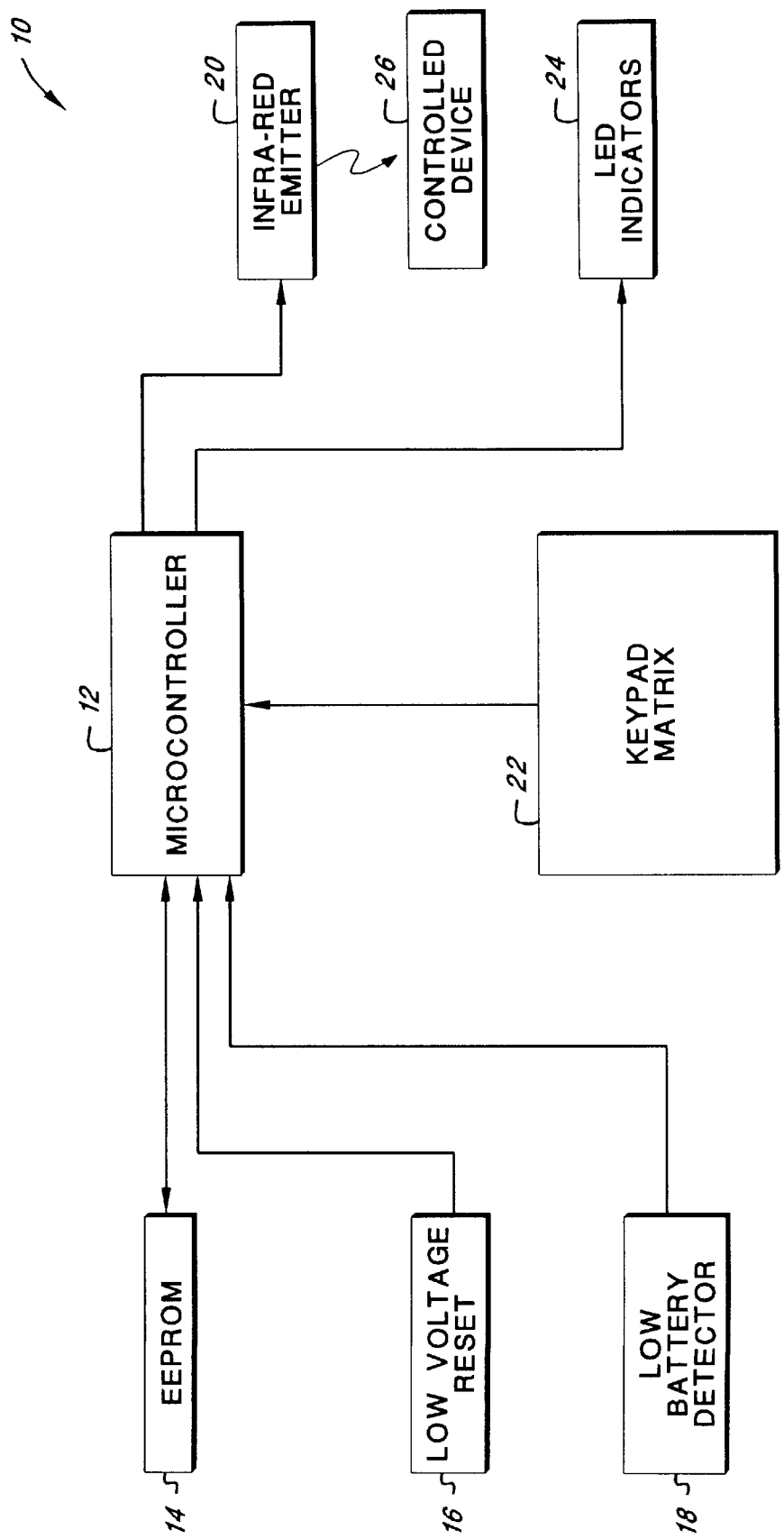
FIG. 1A is a block diagram illustrating one remote control device embodying various aspects of the present invention.

Referring first to FIG. 1A, a block diagram is shown illustrating one remote control device 10 embodying various aspects of the present invention. The remote control device 10 employs a microcontroller 12 coupled to an electronically erasable programmable read only memory (EEPROM) 14, a low voltage reset circuit 16, a low battery detector 18, an infrared emitter 20, a keypad 22, and one or more light emitting diode (LED) indicators 24.

The microcontroller 12, generally, is modified with an appropriate control program, such as illustrated in FIG. 6, and controls operation of the remote control device 10 by responding to user input made through the keypad 22. The microcontroller responds to such input by initiating appropriate portions of the control program. For example, the microcontroller 12 may initiate the generation of a coded sequence of infrared emissions (coded infrared sequence) through the infrared emitter 20 in response to depression of keys on the keypad 22. Specifically, for example, in response to depression of a channel up key (or button) on the keypad 22, the microcontroller 12 may initiate a transmit routine to generate coded infrared sequences in response to which a television receiver (or other controlled device) increments a channel number to which it is tuned. Other specific examples of coded infrared sequences that may be generated in response to a routine in the microcontroller 12 in response to depression of a key on the keypad 22 may cause the channel number to decrement, audio volume to increase or decrease, or a particular channel number to be tuned by the controlled device 26.

The microcontroller 12 may also initiate one of two programming routines. The first of the two programming routines is used to program a channel number into a memory location in the EEPROM 14 associated with a pre-labeled network key on the keypad 22. The second of the two programming routines is used to program one or more channel numbers into memory locations in the EEPROM 14 associated with a channel group key (or scan group key). A more detailed explanation of these two programming routines is made hereinbelow in reference to FIGS. 2, 3, 4, and 6.

The keypad 22 employs an array of conductive rubber switches, such as are known in the art. Suitable custom keypads are available from numerous manufacturers.

The EEPROM 14 provides memory storage for channel numbers assigned to the pre-labeled network keys, and to the channel group keys. The EEPROM 14 also provides memory storage for information required by the microcontroller 12 to generate electrical signals needed to construct the coded infrared sequences generated by the infrared emitter 20. Preferably, the EEPROM 14 contains a plurality of sets of such information (referred to herein as information sets), each of which can be used to control a different model and/or make of controlled device 26. During an initial setup of the remote control device 10, a user indicates to the remote control device 10 the model and/or make of controlled device 26 with which the remote control device 10 is to be used. (Such initial setup is described below.) Based on this indication, the microcontroller 12 selects the information set that will be utilized to construct the coded infrared sequences during future usage of the remote control device 10 with the controlled device 26. Advantageously, the remote control device 10 may also contain information sets needed to construct the coded infrared sequences for controlling devices other than television receivers, such as video cassette recorders (VCR's), cable "boxes", satellite dish controllers, and/or other audio/video-type equipment.

The remote control device 10 may be set up to control several different controlled devices. So that the user can indicate to the microcontroller 12 which of these controlled devices is to be controlled by a subsequent depression of a key on the keypad 22, the user may precede depression of a key or keys on the keypad 22 by depressing a controlled device selection key on the keypad 22, which indicates the particular controlled device to be controlled. Each of the controlled device selection keys 66 causes the microcontroller 12 to utilize a different information set from the EEPROM 14 in constructing the coded infrared sequences to be transmitted by the infrared emitter 20. For example, if the user wishes to control a television receiver, he or she first may press a controlled device selection key labeled "TV" (or "TV 1"), and then press a key associated with the function he or she desires on the television receiver. Once the user presses the "TV" key, the microcontroller 12 will use the information set for the model and/or make of television previously identified by the user in constructing the coded infrared sequences for the desired function. If the user wishes to control, for example, his or her VCR, he or she precedes any key depressions indicating functions to be carried out by the VCR with a depression of a controlled device selection key labeled "VCR" (or "VCR 1"). Once the user presses the "VCR" key, the microcontroller 12 will use the information set for the model and/or make of VCR previously identified by the user.

The infrared emitter 20, (or infrared transmitter) converts electrical signals generated by the microcontroller 12 (which are indicative of the coded infrared sequences to be emitted from the infrared emitter 20) into appropriate coded infrared sequences. A suitable infrared emitter is available as Part No. SIR-5635B3F, from Rohm Corporation of Tokyo, Japan. Preferably, a plurality of such infrared emitters are wired in parallel, and simultaneously emit the same coded infrared sequence, so as to maximize the amount of infrared light being emitted from the remote control device 10, hopefully increasing the probability that the coded infrared sequence will be received and properly acted upon by the controlled device 26.

The LED indicators 24 are utilized by the present embodiment to indicate to the user various statuses of the remote control device 10. For example, the LED indicators 24 may be used to indicate when the remote control device 10 is in a programming mode, when a key on the keypad 22 is being depressed, and/or which of a plurality of controlled devices will be controlled by subsequent depressions of keys on the keypad 22 of the remote control device 10.

The low voltage reset circuit 16 disables the microcontroller 12 in the event a battery power supply (not shown) is unable to generate a sufficient voltage for proper operation of the microcontroller 12.

The low battery detector 18 indicates to the microcontroller 12 when the voltage generated by the battery power supply has fallen below a prescribed threshold (which is higher than the voltage at which the low voltage reset circuit 16 disables the microcontroller 12). In response to the indication from the low battery detector 18, the microcontroller 12 may cause one or more of the LED indicators 24 to indicate to the user (by, e.g., flickering) that battery voltage is getting low.

Figure 1B:
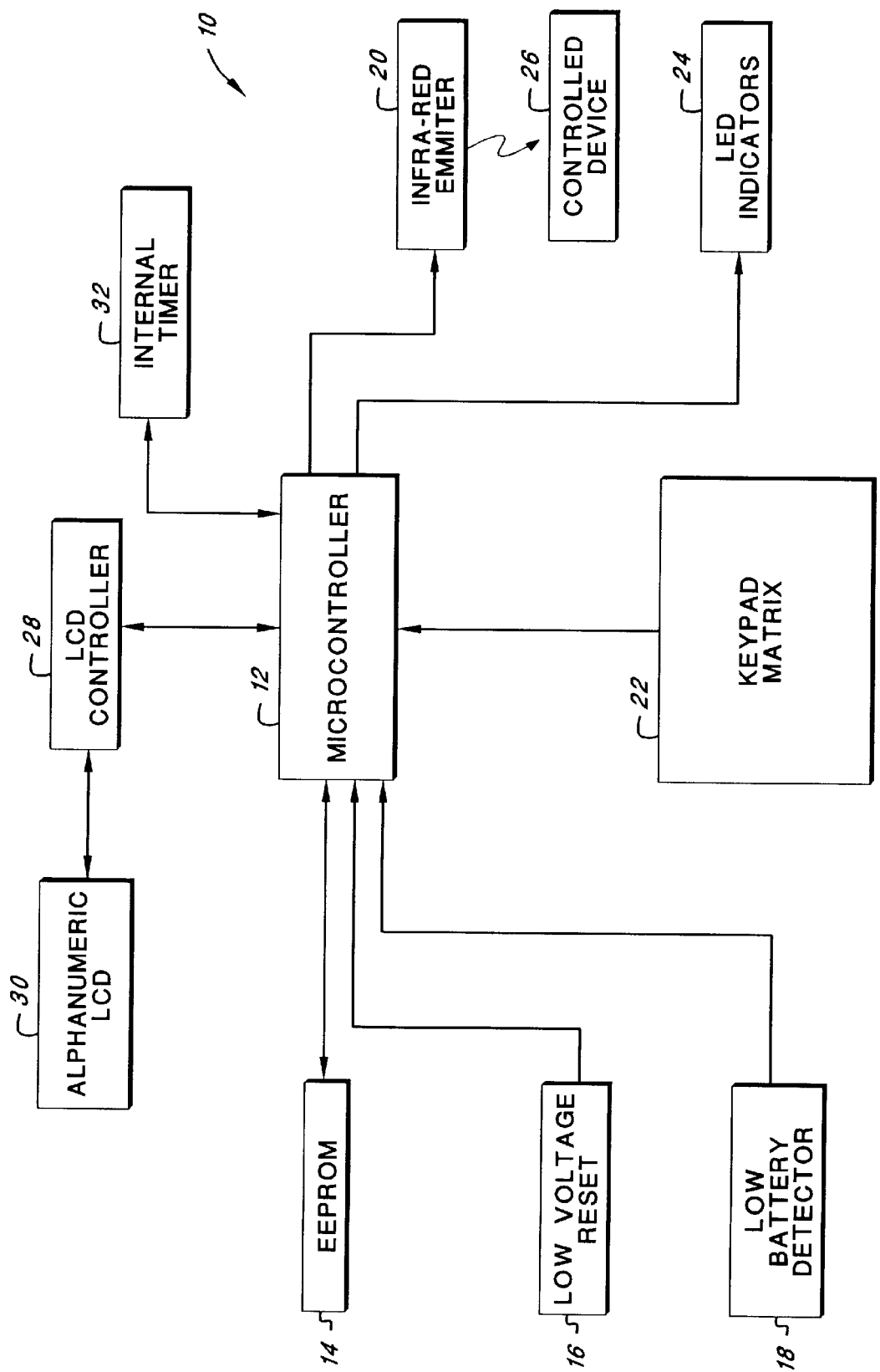
FIG. 1B is a block diagram illustrating a variation of the remote control device of FIG. 1A with an Alphanumeric Liquid Crystal Display (LCD), an LCD Controller, and a timer.

As shown in FIG. 1B, another embodiment of the remote control device of FIG. 1A may additionally employ a Liquid Crystal Display (LCD) Controller 28, an Alphanumeric LCD 30, and a timer 32. The LCD controller 28 can be an LCD controller selected from the numerous and well known LCD controllers that are now readily commercially available. The LCD Controller 28 is coupled to the microcontroller 12 and receives commands from the microcontroller 12 in order to display appropriate information. The Alphanumeric LCD 30 is coupled to the LCD Controller 28 and displays information and messages according to a subroutine contained within the microcontroller 12. For example, the Alphanumeric LCD 30 may "echo" the user's key depressions to visually confirm what the user has inputted. Additionally, the Alphanumeric LCD 30 may display messages and/or instructions to the user during programming or operation of the remote control device.

As seen in FIG. 1B, the remote control device 10 may further include a timer 32 for keeping the current time, i.e., the present time of day, and/or date and for performing timing functions of the remote control device 10, e.g., the "time lock" function described in further detail below. The timer 32 is coupled to the microcontroller 12 and provides a timing signal thereto so that the microcontroller 12 can perform timed operations and subroutines. The timer 32 is preferably a part of the microcontroller 12, as is common in the art, but may also be a distinct component or circuit should such be desirable. For example, the "timed lock out" and the "30 Second Timeout" features of the present embodiment require the microcontroller 12 to receive synchronization and timing signals from the timer 32.

Figure 2:
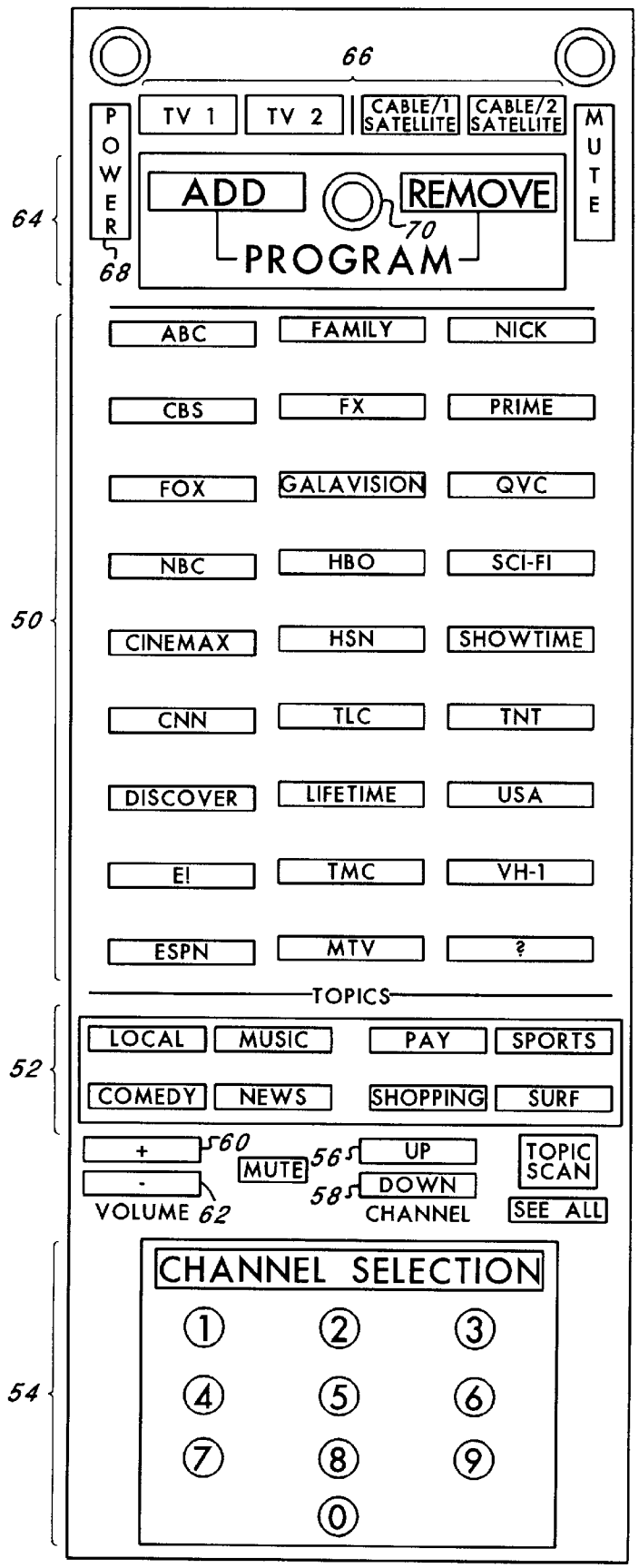
FIG. 2 is one example of a keypad layout usable with the remote control device of FIG. 1.

Referring next to FIG. 2, one example is shown of a keypad layout usable with the remote control device of FIG. 1. The keypad is shown with the pre-labeled network keys 50, the channel group keys 52, channel number keys 54, channel up/down keys 56, 58, volume up/down keys 60, 62, programming keys 64, controlled device selection keys 66, and a power key 68.

In order to select a television network on which to view programming, the user of the remote control device 10 may depress a pre-labeled network key 50 labeled with the television network on which he or she wishes to view programming. As described below, in reference to FIG. 6, each of the pre-labeled network keys 50 has been programmed with a corresponding channel number so as to cause the microcontroller 12 (FIG. 1) to generate electrical signals corresponding to coded infrared sequences that direct the controlled device to tune to the channel number on which a particular network (as identified on the pre-labeled network key) is carried in a particular viewing area.

The channel group keys 52, when depressed, instruct the microcontroller 12 (FIG. 1) to generate electrical signals corresponding to coded infrared sequences that instruct the controlled device 26 (FIG. 1) to tune to one of a plurality of channel numbers within a channel group corresponding to the depressed channel group key. Each time the channel group key is depressed, electrical signals are generated by the microcontroller 12 (FIG. 1) corresponding to coded infrared sequences instructing the controlled device 26 (FIG. 1) to tune to the next channel number within the channel group. When the last channel number within the channel group has been reached, a subsequent depression of the channel group key 52 results in the microcontroller 12 (FIG. 1) being directed to generate electrical signals corresponding to coded infrared sequences that instruct the controlled device to tune to the first channel number within the channel group. As above, subsequent depressions of the channel group key 52 result in the generation of electrical signals by the microcontroller 12 (FIG. 1) that instruct the controlled device 20 (FIG. 1) to tune to the next channel number within the channel group until the last channel number within the channel group is again reached.

In this way, the user of the remote control device 10 is able to "scan" (or "surf") through each of the channels within the channel group by repeatedly depressing the channel group key 52 so that each of the channels within the channel group is sequentially displayed. The channel numbers within each channel group are programmed in a manner described hereinbelow in reference to FIG. 6.

Note that in the present embodiment, the smallest channel number in a given channel group is deemed to be the first channel number in the given channel group, and the largest channel number within the given channel group is deemed to be the last channel number in the given channel group. Any channel numbers in the given channel group lying numerically between the first and last channel numbers in the given channel group are ordered numerically from smallest to largest for purposes of determining their order within the given channel group, i.e., for determining the order in which electrical signals for such channel numbers will be generated in response to successive depressions of the channel group key for the given channel group. While the present embodiment relies on the magnitude, i.e., the "number", of the channel number within the given channel group for purposes of determining their order within such channel group, one skilled in the art will recognize that numerous methods of ordering channels within channel groups could be utilized with the present embodiment. Such numerous other methods for ordering channel numbers within channel groups are contemplated by the inventor.

The channel up/down keys 56, 58, the volume up/down keys 60, 62, the channel number keys 54, and the power key 68 operate in a conventional manner (except as described otherwise herein), and therefore further description of these keys is not made herein.

The controlled device selection keys 66 are used to select the device the user desires to control using the remote control device 10. When one of the controlled device selection keys 66 is depressed, the microcontroller 12 (FIG. 1) is instructed to utilize a set of instructions (i.e., an instruction set) within the EEPROM 14 (FIG. 1), corresponding to the device the user desires to control. For example, if the user wishes to control a first television receiver, he or she first depresses a controlled device selection key labeled "TV 1", i.e., the "TV 1" key, which instructs the microcontroller 12 (FIG. 1) to employ an instruction set corresponding to the model and/or brand of the first television receiver, i.e., the television receiver associated with the "TV 1" key, as described hereinbelow.

Having pressed the "TV 1" key, and thus instructed the microcontroller 12 (FIG. 1) to utilize an instruction set for the first television receiver, the user may now depress any of the other keys on the keypad. Such depression will cause the microcontroller 12 (FIG. 1) to generate electrical signals, as prescribed by the information set utilized, appropriate to the first television receiver. For example, if the user wishes to view programming on a particular network, he or she may depress the pre-labeled network key 50 corresponding to such network. In response to the depression of such pre-labeled network key, the appropriate electrical signals are generated by the microcontroller 12 (FIG. 1), in response to which the coded infrared sequences are generated that instruct the first television receiver to tune to the particular network.

In order to associate a controlled device selection key 66 with a particular set of instructions in the EEPROM, the user depresses the "Add" and "Delete" (or "Remove") programming keys 64 simultaneously until a "program" LED indicator 70 illuminates. Next, the user determines a three number code corresponding to the controlled device that he or she wishes to associate with the particular controlled device selection key 66. The three number code may be listed in documentation accompanying the remote control device 10, and identifies the particular instruction set within the EEPROM 14 that is to be used with the controlled device to be associated with the controlled device selection key being programmed.

Once the user determines the appropriate three digit code, he or she enters the three digit code using the channel number keys 54. Following entry of the three digit code, the user depresses the controlled device selection key 66 that he or she wishes to associate with the controlled device. This procedure may be repeated for each controlled device the user wishes to associate with a controlled device selection key 66, with the user selecting a different controlled device selection 66 key following each three digit code entry.

Within the microcontroller 12 (FIG. 1), the three digit code indicates an address within the EEPROM 14 (FIG. 1) at which an instruction set is located for generating electrical signals used to generate the coded infrared sequences for controlling the particular controlled device.

In order to program the pre-labeled network keys 50, the user depresses the "Add" and the "Delete"key simultaneously until the program LED indicator 70 illuminates, indicating that the remote control is in the programming mode. Using the channel number keys 54, the user indicates the channel number on which the network identified on the pre-labeled network key provides programming in the user's area. After entering the channel number, the user depresses the pre-labeled network key 50 corresponding to the network providing programming on the already entered channel number. This sequence is repeated for each pre-labeled network key to be programmed. After the user has programmed all of the pre-labeled network keys 50 that he or she wishes to program, he or she presses the power key 68, which causes the remote control device 10 to exit from the programming mode. In response to depression of the power key, the program LED indicator 70 is extinguished.

In order to program the channel group keys 52, the user depresses the "Add" key and the "Delete" keys 64 simultaneously until the program LED indicator 70 illuminates. The user then depresses the channel group key 52 for the channel group to which he or she wishes to add or from which he or she wishes to remove channel numbers. Next, using the channel number keys 54, he or she enters the number of the channel that he or she wishes to add to or remove from the channel group indicated.

If the user wishes to add the channel number to the channel group, he or she follows entry of the channel number by depressing the "Add" programming key 64 in order to confirm the addition of the channel number to the indicated channel group. If the user wishes to delete a channel from a channel group, he or she can locate the channel within the channel group by using the channel up/channel down keys 56, 58 to scroll through (i.e., cause the controlled device to tune in sequence) the channel numbers of the channel group until the channel to be deleted is tuned by the controlled device 26. Once the channel to be deleted is tuned by the controlled device 26, the user depresses the "Delete" key 64 in order to delete the channel number from the channel group. Once all desired additions and/or deletions have been made from the channel group, the user exits the programming mode by depressing the power key, which results in the extinguishing of the program LED indicator 70.

One of the channel group keys functions in a manner slightly different than that in which the remaining channel group keys function. This channel group key is referred to as the "personal surf" key. The "personal surf" key allows multiple users of the remote control device 10 to each create a personal channel group containing channel numbers through which he or she wishes to scan from time to time. Programming of the "personal surf" key is carried out in a manner similar to that in which the remaining channel group keys are programmed, except as noted below. In order to program the "personal surf" key, the user depresses the "Add" and the "Delete" keys (i.e., the programming keys) 64 simultaneously until the program LED indicator 70 illuminates. The user then depresses the "personal surf" key for the personal channel group to which he or she wishes to add or from which he or she wishes to remove channel numbers. Next, unlike when programming the channel group keys 52, the user must indicate his or her "personal surf" number using the channel number keys 54. Possible "personal surf" numbers include the numbers 1–9. Following entering the "personal surf" number, the user must then press the "personal surf" key again, within three seconds after entering the "personal surf" number. Thus, for example, if the user having a "personal surf" number of 3 wishes to add a channel number to or delete a channel number from his or her personal channel group, he or she depresses the channel number key labeled with the number 3, following depression of the "personal surf" key. The user then depresses the "personal surf" key again, within three seconds of depressing the channel number key labeled with the number 3. Following depression of the "personal surf" key again, using the channel number keys 54, he or she enters the number of the channel that he or she wishes to add to or remove from his or her personal channel group.

If the user wishes to add the channel number to his or her personal channel group, he or she follows entry of the channel number by depressing the "Add" programming key 64 in order to confirm the addition of the channel number to his or her personal channel group. If the user wishes to delete a channel from his or her personal channel group, he or she can locate the channel within his or her personal channel group by using the channel up/channel down keys 56, 58 to scroll through (i.e., cause the controlled device to tune in sequence) the channel numbers of his or her personal channel group until the channel to be deleted is tuned by the controlled device 26. Once the channel to be deleted is tuned by the controlled device 26, the user depresses the "Delete" key 64 in order to delete the channel number from his or her personal channel group. Once all desired additions and/or deletions have been made from the user's personal channel group, the user exits the programming mode by depressing the power key 68, which results in the extinguishing of the program LED indicator 70.

In order to use the "personal surf" key the user must first press the "personal surf" key, and then, within three seconds, indicate his or her "personal surf" number using the channel number keys 54. As mentioned above, possible "personal surf" numbers include the numbers 1–9. Thus, for example, if a user having a "personal surf" number of 3 wishes to scan through the channel numbers within his or her "personal surf" channel group, he or she first depresses the "personal surf" key and then, within three seconds, depresses the channel number key labeled with the number 3. Then the user presses the "personal surf" key again.

Following depression of the "personal surf" key, the microcontroller 12 (FIG. 1) generates electrical signals corresponding to coded infrared sequences that direct the controlled device 26 to tune to the first channel number in that user's "personal surf" channel group. Such electrical signals are generated as a function of the information set for the particular controlled device being controlled, and of the user's "personal surf" channel group, which is stored in the EEPROM 14 (FIG. 1). Subsequent depression of the channel up/down keys 56, 58, which need not be preceded by depression of the "personal surf" key or the user's "personal surf" number, results in the generation of electrical signals corresponding to coded infrared sequences for tuning the next or previous channel number, respectively in that user's "personal surf" channel group.

The channel up/down keys 56, 58 can also be used following the other channel group keys 52 to step through the channel numbers in the respective channel groups, in either forward or reverse order, however, unlike with the personal channel groups, the other channel groups can be stepped through in a forward direction by depressing the respective channel group key. With the personal channel groups, only the channel up/down keys 56, 58 can be used, in the present embodiment, to step through such channel groups. Regardless of whether the channel up/down keys 56, 58 are used following a channel group key on following the "personal surf" key, depression of any of the channel number keys 54, causes the channel up/down keys 56, 58 to revert to normal operation, in which they function in the conventional manner to sequentially step through channel numbers as is known in the art.

As with the other channel group keys 52, when the last channel number in the user's "personal surf" channel group is selected, subsequent depression of the user's "personal surf" key will result in the generation of electrical signals corresponding to coded infrared sequences that instruct the controlled device 26 to tune to the first channel number in the user's "personal surf" channel group. Subsequent depressions of the "personal surf" key scan through the channel numbers in the user's "personal surf" channel group as described above. In this way, each of a plurality of users (up to nine in the preferred embodiment) of the remote control device 10 can each have a "personal surf" channel group made up of channel numbers on which television networks provide programming through which the user desires to scan from time to time.

Figure 3:
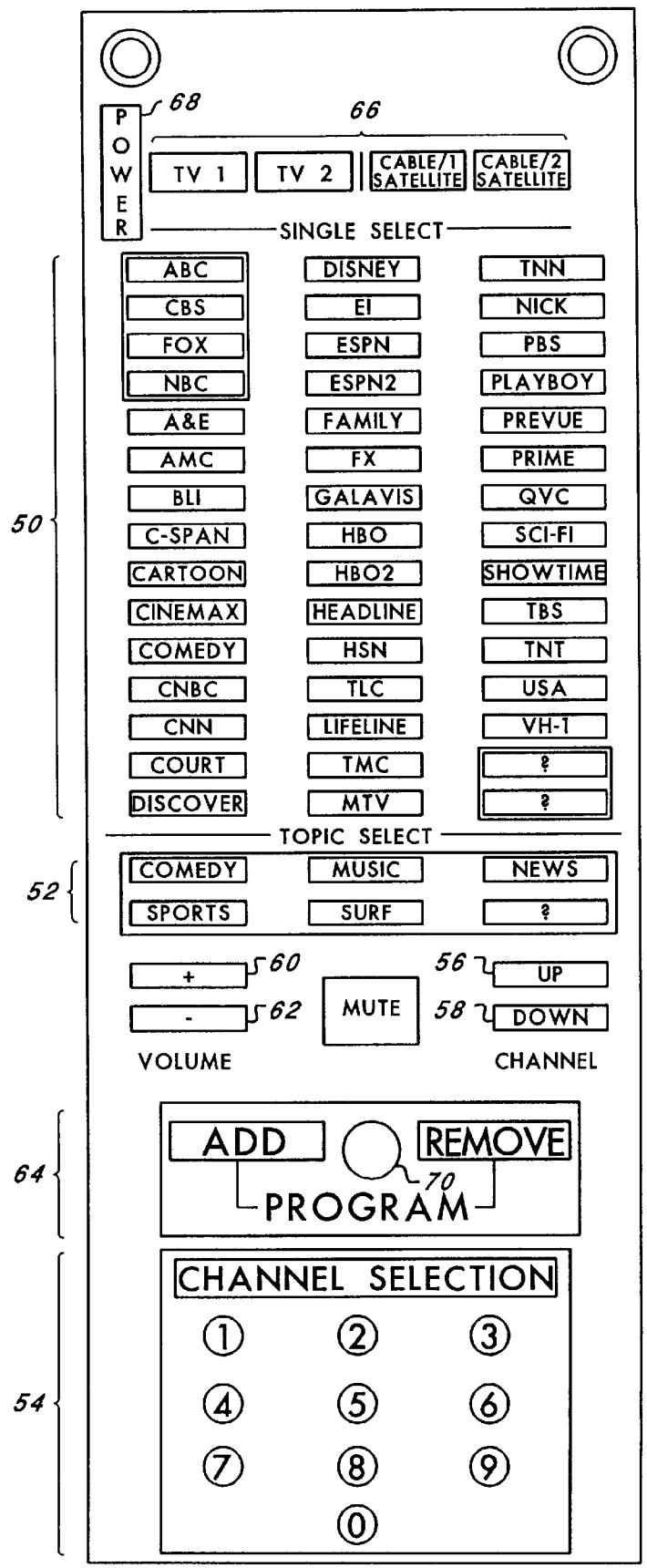
FIG. 3 is another example of a keypad layout usable with the remote control device of FIG. 1.

Referring next to FIG. 3, another example is shown of a keypad layout usable with the remote control device of FIG. 1. The keypad layout of FIG. 3 is utilized in a manner similar to that described above in reference to FIG. 2, and therefore further explanation is not made herein.

Figure 4A:
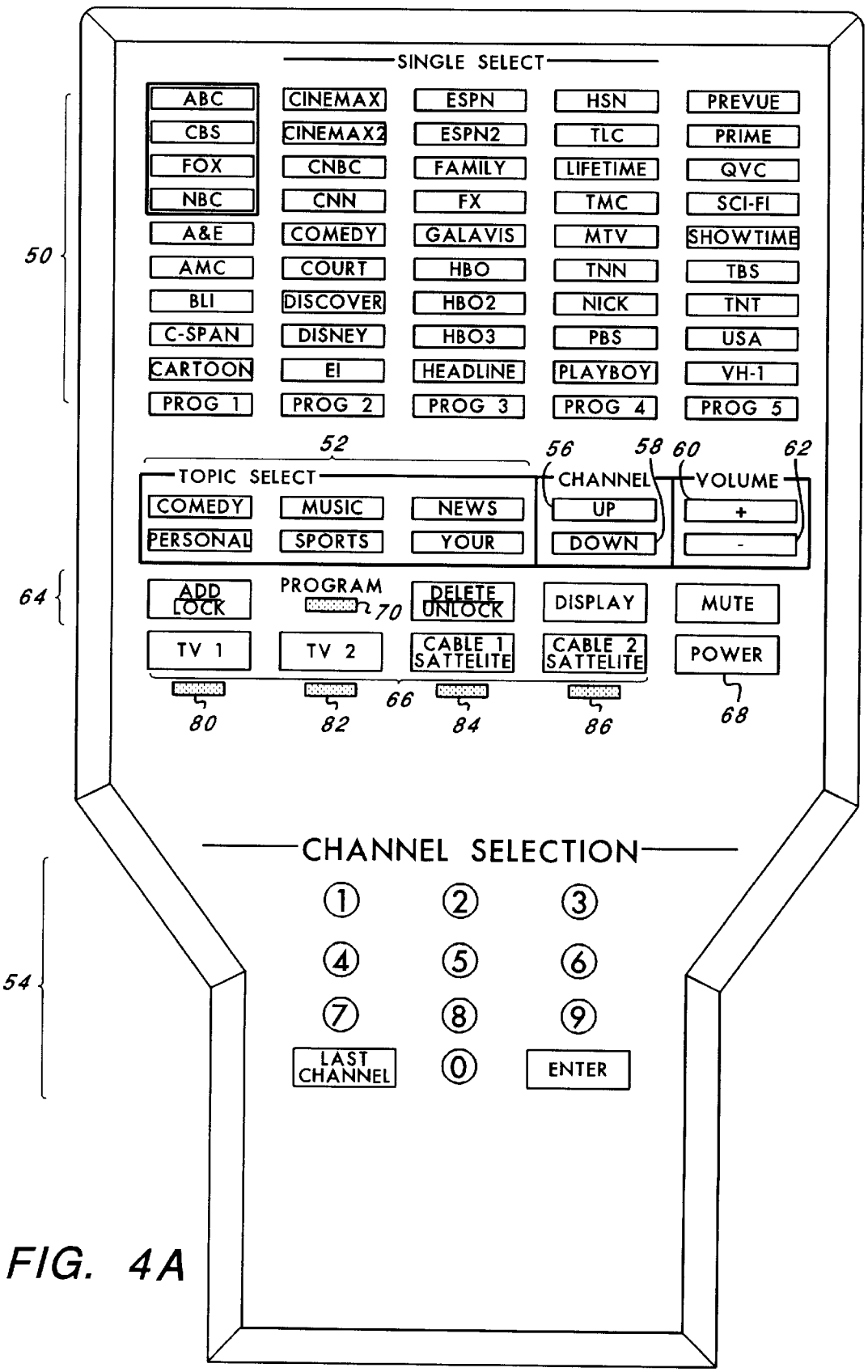
FIG. 4A is a preferred example of a keypad layout usable with the remote control device of FIG. 1A.

Referring to FIG. 4A, a preferred example is shown of a keypad layout usable with the remote control device of FIG. 1. The keypad layout of FIG. 4A is also utilized in a manner similar to that described above in reference to FIG. 2, but includes additional features as described below. In FIG. 4A, additional LED indicators 80, 82, 84, 86 are shown proximate to each of the controlled device selection keys. When a key on the keypad is depressed, the additional LED indicator 80, 82, 84, 86 proximate to the controlled device selection key for the currently controlled device illuminates, or flickers. After another of the controlled device selection keys is depressed, in order to change the controlled device being controlled, the additional LED indicator 80, 82, 84 or 86 proximate to the other device selection key will illuminate, or flicker, during subsequent depressions of keys on the keypad, until a further device selection key 80, 82, 84 or 86 is depressed.

One exception to the above-described method of operation, is used in the present embodiment when the low battery detector 18 (FIG. 1) detects that the voltage provided by the battery power supply has dropped below a prescribed threshold. Under this circumstance, rather than a single additional LED indicator 80, 82, 84 or 86 illuminating, or flickering, when a key on the keypad is depressed, all of the additional LED indicators 80, 82, 84, 86 simultaneously illuminate whenever a key on the keypad is depressed. This exception to the above-described method of operation provides a visual indication to the user of the remote control device whenever the battery voltage falls below the threshold and a key on the keypad is depressed. Such visual indication signals the user to replace the batteries within the remote control device 10.

Another feature of the example of FIG. 4A utilizes a "lock" key 88 and an "unlock" key 90. These keys 88, 90, and an appropriate control routine in the microcontroller 12 (FIG. 1) allow the user of the remote control device to "lock out" and "unlock" any of the pre-labeled network keys 50 or the channel group keys 52, so that other users of the remote control device cannot use the remote control device to view the channel number(s) associated with such keys. For example, this feature is of particular use when a parent wishes to "lock out" channel numbers that provide programming having an "adult" content, such a violence, nudity, profanity or the like.

In order to "lock out" a pre-labeled network key 50, the user depresses the "lock" key 88 until the program LED indicator 70 illuminates. The user then enters a three digit access code of his or her choosing, and then depresses the "lock" key 88 again. The program LED indicator 70 will then begin to flicker, signaling the user to depress the pre-labeled network key 50 and/or the channel group key 52 that he or she wishes to "lock out". The user then depresses any pre-labeled network key 50 and/or channel group key 52 that he or she wishes to have "locked out", and, when finished, depresses the power key 68. The program LED indicator 70 then extinguishes, and the remote control device 10 functions as described above, except that any depressions of keys that have been locked out will be ignored by the remote control device 10.

When the user wishes to "unlock" the pre-labeled network keys and/or the channel group keys that have been "locked out", so that he or she can view programming on channel numbers associated with such keys, he or she presses the "unlock" key 80 until the program LED indicator 70 illuminates. The user then enters the three digit code used to lock the "locked out" keys, and presses the "unlock" key 80 again to unlock all of the "locked out" keys. The program LED indicator 70 will then extinguish, indicating that all of the keys on the keypad have been unlocked.

Advantageously, the above-described functionality allows a user to "lock out" keys on the keypad that are associated with channel numbers carrying television programming that the user does not wish other users of the remote control device 10 to view, but at the same time, provides the ability for the user to "unlock" such keys so that he or she may view programming on channel numbers associated with such keys.

Figure 4B:
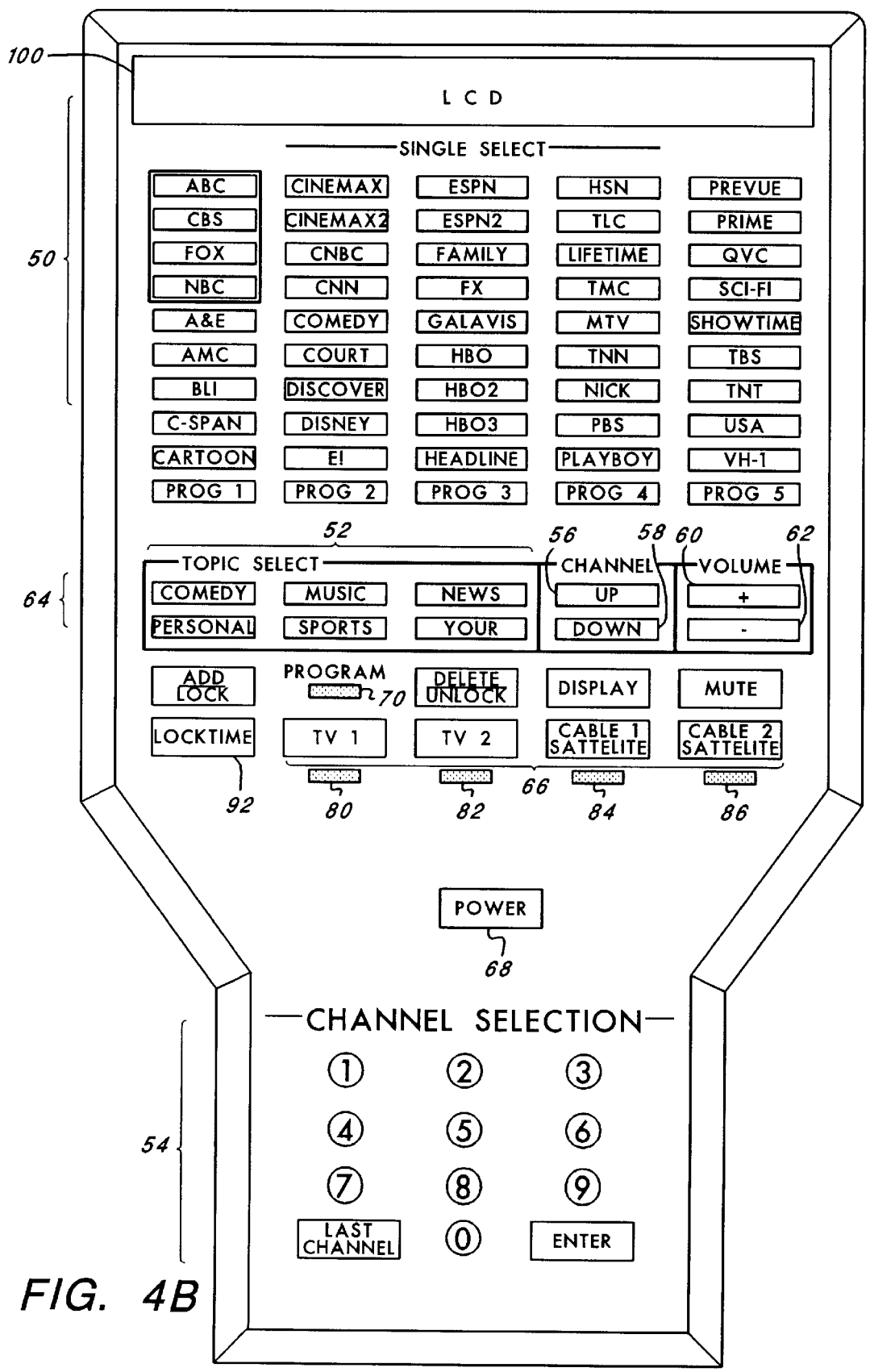
FIG. 4B is a preferred example of a keypad layout usable with the remote control device of FIG. 1B.

Referring next to FIG. 4B, another embodiment of a remote control device 10 is shown featuring an Alphanumeric LCD 100 and a "time lock" key 92. The Alphanumeric LCD 100 displays information and/or instructions to the user during operation and programming of the remote control device 10. The "time lock" key 92, along with a subroutine executed by the microcontroller 12 (FIG. 1), allows a user to lock-out pre-labeled network keys and/or channel group keys during specific times and/or days of the week.

Additionally, the "time-lock" key 92 allows the user to selectively lock out certain channel numbers for the time periods during which select television programs are scheduled to "air" on such channel numbers. For example, if a user wants to lock out certain channels from 10:00 pm to 7:00 am, on Sundays and Tuesdays, the user is able to do so using the "time lock" key of the present embodiment.

In order to "time lock" a pre-labeled network key 50, or channel group key 52, the user follows the steps described above for locking out such keys. Specifically, the user presses the lock key 88, enters a three digit access code of his or her choosing, and then selects the pre-labeled network key 50 and/or the channel group key 52 that he or she wishes to "time lock." Next, the user presses the "time lock" key 92 before pressing the power key 68 as described above.

Upon pressing the "time lock" key 92, the LCD 100 will display "Enter Lock Start Time," at which point the user may enter a time at which he or she would like the selected pre-labeled network key 50 or channel group key 52 to be locked out. In one variation of the present embodiment, the remote control device is programmed to receive standard "military time" entries, e.g., 0800 for 8:00 AM and 2000 for 8:00 PM. Entry of time entries is performed by the user depressing channel number keys corresponding to the digits of the "military time" the user wishes to enter. Upon receiving a valid time entry, the microcontroller 12 (FIG. 1) stores the inputted time, i.e., the "lock start time," in the EEPROM 14 (FIG. 1). The LCD 100 then displays "Enter Unlock Time," at which point the user may enter the time at which he or she wishes the selected key to be unlocked. Such entry is performed in a manner similar to that described above for the "lock start time."

Optionally, the user can also select the day(s) of the week during which the user wants the selected key(s) to be locked for the designated times. When such option is implemented, the LCD 100 displays "Enter The Day Of Week," at which point the user may depress any of the channel number keys labeled one through seven, corresponding to the seven days of the week, or enter "0" to indicate that he or she wishes to lock out the selected key at the designated time for all days of the week. After entering these desired "lock-out days," the user then presses the power key 68 to indicate that he or she is finished entering the days of the week during which a particular lock-out is to occur.

Figure 5:
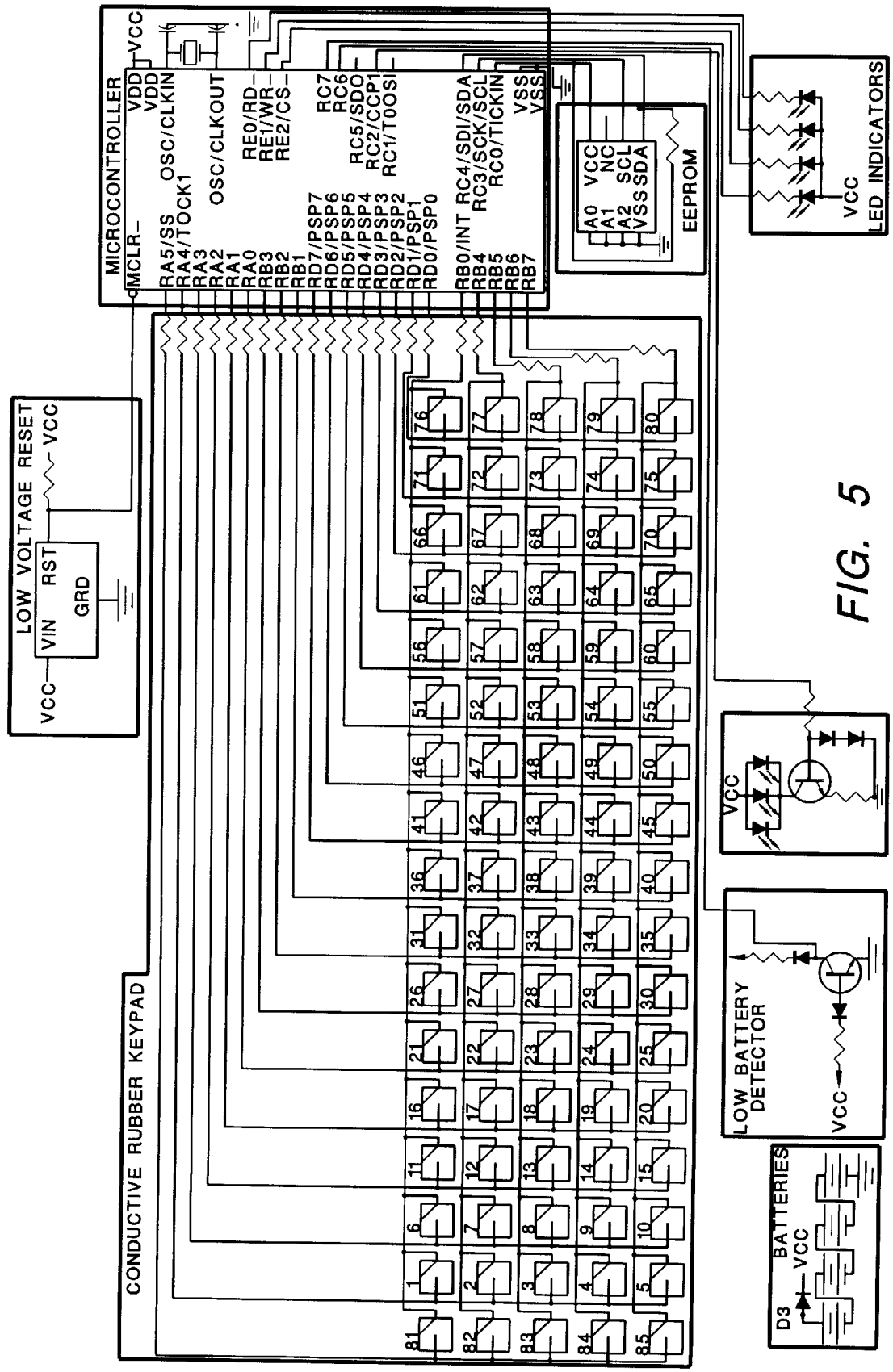
FIG. 5 is a detailed schematic diagram showing one implementation of the remote control device of FIG. 1.

Referring next to FIG. 5, a detailed schematic diagram is shown of one implementation of the remote control device of FIG. 1. One variation of the microcontroller 12, the EEPROM 14, the low voltage reset circuit 16, the low battery detector 18, the infrared emitter 20, and the LED indicators 24 are shown. As the schematic diagram of FIG. 5 should be self-explanatory to one of skill in the art, further explanation is not made herein.

Referring next to FIG. 6, a flow diagram is shown of the steps traversed by the microcontroller 12 (FIG. 1) in response to a control program. When the remote control device 10 is reset (Block 1000, FIG. 6A), such as occurs when the power is first supplied to the remote control device 10, the microcontroller 12 (FIG. 1) is initialized (Block 1002), all registers within the microcontroller are initialized (Block 1004), and an interrupt routine is executed (Block 1004) to detect when a key on the keypad 22 (FIG. 1) is pressed. Next, the microcontroller 12 (FIG. 1) is put (Block 1006) into a "sleep" mode to await the depression of a key on the keypad 22 (FIG. 1), as detected by the interrupt routine. Utilization of the sleep mode in this manner results in power savings when the remote control device is not in use.

Upon the depression of a key on the keypad 22 (FIG. 1), the microcontroller 12 (FIG. 1) wakes up and the interrupt routine begins execution (Block 1008). Before the keypad 22 (FIG. 1) is scanned, the microcontroller 12 (FIG. 1) waits 20 milliseconds (Block 1010). Then, a determination is made (Block 1012) as to whether the key depressed is a valid key. If the key depressed is not a valid key (Block 1012), the microcontroller is put back to sleep (Block 1006) until a key on the keypad 22 (FIG. 1) is again depressed.

If, however, the key depressed is a valid key (Block 1012), a determination is made as to what key was depressed (Block 1014). In the event the key depressed is a direct transmission button, i.e., one of the channel number keys 54 (FIGS. 2, 3, 4), i.e., a key labeled with a number between 0 and 9; the volume up key 60 (FIGS. 2, 3, 4); the volume down key 62 (FIGS. 2, 3, 4); the channel up key 56 (FIGS. 2, 3, 4); the channel down key 58; a mute key; a display key; a last channel recall key; an enter key; or the power key 68 (FIGS. 2, 3, 4) (Block 1016), a further determination is made as to whether the key depressed was a channel number key (Block 1017). If the key depressed was a channel number key (Block 1017), the channel up/down keys are associated (Block 1018) with a software routine for directing the remote control device to transmit coded infrared sequences for sequentially tuning the controlled device to a next or a previous channel number tuneable by the controlled device. (This is done in case the channel up/down keys 56, 58 have been associated with a software routine for tuning the controlled device to a next or a previous channel number within a channel group, as mentioned below). Next, regardless of whether a channel number key was the direct transmission button depressed, information corresponding to the key depressed is retrieved from an appropriate information set (i.e., appropriate to the particular controlled device being controlled) in the EEPROM 14 (FIG. 1). The information is used by the microcontroller 12 (FIG. 1) to generate the electrical signals, which in turn are passed to the infrared emitter 20 (FIG. 1) and are used by the infrared emitter 20 (FIG. 1) to generate (Block 1019) the coded infrared sequences appropriate to the depressed key. (A more detailed explanation of how the coded infrared sequences are generated is made below in reference to FIG. 7.) It is in response to the coded infrared sequences that the controlled device 26 (FIG. 1) takes an action appropriate to the key that is depressed, e.g., tunes to a particular channel, increases volume, etc. Following transmission of the coded infrared sequences (Block 1019), the microcontroller 12 (FIG. 1) is again put to sleep until a key on the keypad 22 (FIG. 1) is depressed (Block 1006).

In the event the key depressed (Blocks 1008, 1010, 1012, 1014) is not a direct transmission button (Block 1016), a determination is made (Block 1020) as to whether the key depressed is a "preset" button, i.e., a pre-labeled network key 50 (FIG. 2). In the event the key depressed is a preset button (Block 1020), the channel number assigned to the pre-labeled network key is retrieved (Block 1022) from the EEPROM 14 (FIG. 1) and a transmit preset routine is called (Block 1024). (See FIG. 8 and the accompanying description thereof for a more complete explanation of the transmit preset routine). Basically, the transmit preset routine causes the microcontroller 12 (FIG. 1) to retrieve information from the appropriate information set, corresponding to the retrieved channel number, from the EEPROM 14 (FIG. 1). The information is used by the microcontroller 12 (FIG. 1) to generate electrical signals, which in turn cause the infrared emitter 20 (FIG. 1) to generate coded infrared sequences. These coded infrared sequences cause the controlled device to tune to the channel number that has been assigned to the pre-labeled network key 50 (FIG. 2). Following transmission of the coded infrared sequences, the microcontroller 12 (FIG. 1) is again put to sleep until a key on the keypad is depressed (Block 1006). (Note that the coded infrared sequences generated in response to the depression of a pre-labeled network key or a channel group key are generated in accordance with transmit preset routine of FIG. 8, while the coded infrared sequences generated in response to the depression of a direct transmission button are generated in accordance with the steps shown in FIG. 7.)

In the event the key depressed (Blocks 1008, 1010, 1012, 1014) is not a direct transmission button (Block 1016), and not a preset button (Block 1020), a determination is made as to whether the key depressed is a "preset scan" button, i.e., a channel group key, (Block 1026). If a determination is made that the key depressed is a preset scan button (Block 1026), then a determination is made as to whether the particular preset scan button depressed was the "personal surf" key (Block 1027). If the key depressed was the "personal surf" key (Block 1027), then a select personal list routine is called (Block 1028) (See FIG. 10). Next, regardless of whether the particular preset scan button depressed was the "personal surf" button, a list of the channels within the channel group indicated by the selected preset scan button is retrieved (Block 1029) from the EEPROM 14 (FIG. 1)., and a transmit list routine is called (Block 1030) (See FIG. 8). Then, the microcontroller 12 is put back to sleep and awaits the depression of another key on the keypad (Block 1006).

In the event the key depressed (Block 1008, 1010, 1012, 1014) is not a direct transmit button (Block 1016), not a preset button (Block 1020), and not a preset scan button (Block 1026), a determination is made (Block 1044) as to whether the depressed key is a program "key" (i.e., the "add" key and the "delete" key depressed simultaneously). If the key that is depressed is the program key (Block 1044), the microcontroller 12 (FIG. 1) enters programming mode by setting a programming flag and initiating a 30-second time out (Block 1046, FIG. 6B). In the event the time out period expires (Block 1048) without the depression (Block 1052) of a key on the keypad 22 (FIG. 1), programming mode is terminated (Block 1050) and the microcontroller 12 (FIG. 1) is again put to sleep until a key on the keypad 22 (FIG. 1) is depressed (Block 1006, FIG. 6A).

In the event, however, that a key is pressed (Block 1052) during the time out period (Block 1052), the 30-second time out is reset (Block 1054). Next, a determination is made as to whether the key depressed is a channel number key (Block 1056). If the key depressed is a channel number key (Block 1056), the number of the channel number key is stored (Block 1058) in a temporary register within the microcontroller 12 (FIG. 1), and the 30-second time out is again begun (Block 1048).

If the key depressed is not a channel number key (Block 1056), and not the enter key (Block 1059) a determination is made as to whether the key depressed is an enter key (Block 1059). If the key depressed is the enter key. (Block 1059), an enter key flag is set (1060) within the microcontroller 12 (FIG. 1), and the 30-second time out is initiated (Block 1048) and the remote control device 10 waits for the depression (Block 1052) of a key on the keypad 22 (FIG. 1).

If the key depressed is not a channel number key (Block 1056), and not the enter key (Block 1059) a determination is made as to whether the key depressed is a preset button (Block 1061). In the event the key that is depressed is a preset button (Block 1061), the memory location in the EEPROM 14 (FIG. 1) at which the channel number associated with the preset button is stored is determined (Block 1062). The numbers stored in the temporary registers within the microcontroller 12 (FIG. 1) (up to three) are retrieved (Block 1064) and are moved, along with, if appropriate, an enter key flag, into two 8-bit code numbers (Block 1066) (using, e.g., a binary coded decimal (BCD) format). Note that the enter key flag is moved into the 8-bit code numbers only if an enter key depression is required, as indicated by the prior setting of the enter key flag within the microcontroller 12 (FIG. 1) (See Block 1060). The 8-bit code numbers, with or without the enter key flag, are then stored (Block 1068) in the memory locations of the EEPROM 14 (FIG. 1) associated with the preset button being programmed. Next, the 30-second time out is again initiated (Block 1048) and the remote control device 10 waits for the depression (Block 1052) of a key on the keypad 22 (FIG. 1).

In the event the key depressed was not a channel number key (Block 1056), not the enter key (Block, 1059) and not a preset button (Block 1061), a determination is made as to whether the key depressed was a preset scan button (Block 1070). If the key depressed was a preset scan button (Block 1070), a determination is made as to whether the preset scan button depressed was a "personal surf" key (Block 1071). If the key depressed was a "personal surf" key (Block 1071), a select personal list routine is called (Block 1072) (see FIG. 10). In the event the key depressed was a preset scan button (Block 1070), but was not a "personal surf" key (Block 1071), a determination is made as to the memory location of the channel group associated with the preset scan button (Block 1073). Following the select personal list routine (Block 1072), or following the determination as to the memory location of the channel group associated with the preset scan button (Block 1073), a transmit list routine is called (Block 1074) (see FIG. 9); Next, the 30 second time out is again initiated (Block 1048) until a key on the keypad is depressed (Block 1052).

If, however, the key depressed is not a channel number key (Block 1056), not the enter key (Block 1059), not a preset button (Block 1061), and not a preset scan button (Block 1070), a determination is made as to whether the key depressed is an add button or a delete button (Block 1075).

Figure 6A:
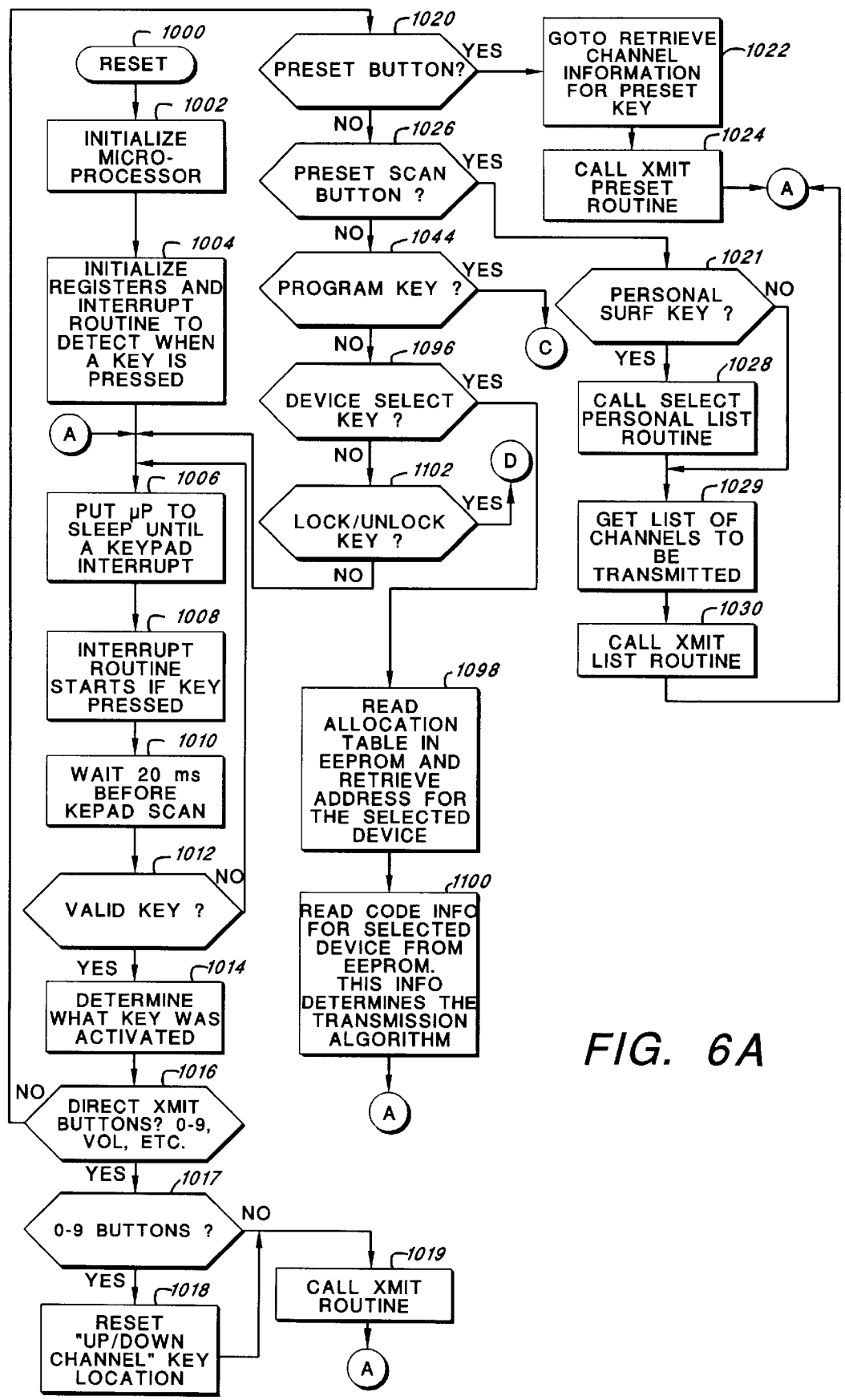
FIG. 6 is a flow diagram of the remote control device of FIG. 1.
Figure 6B:
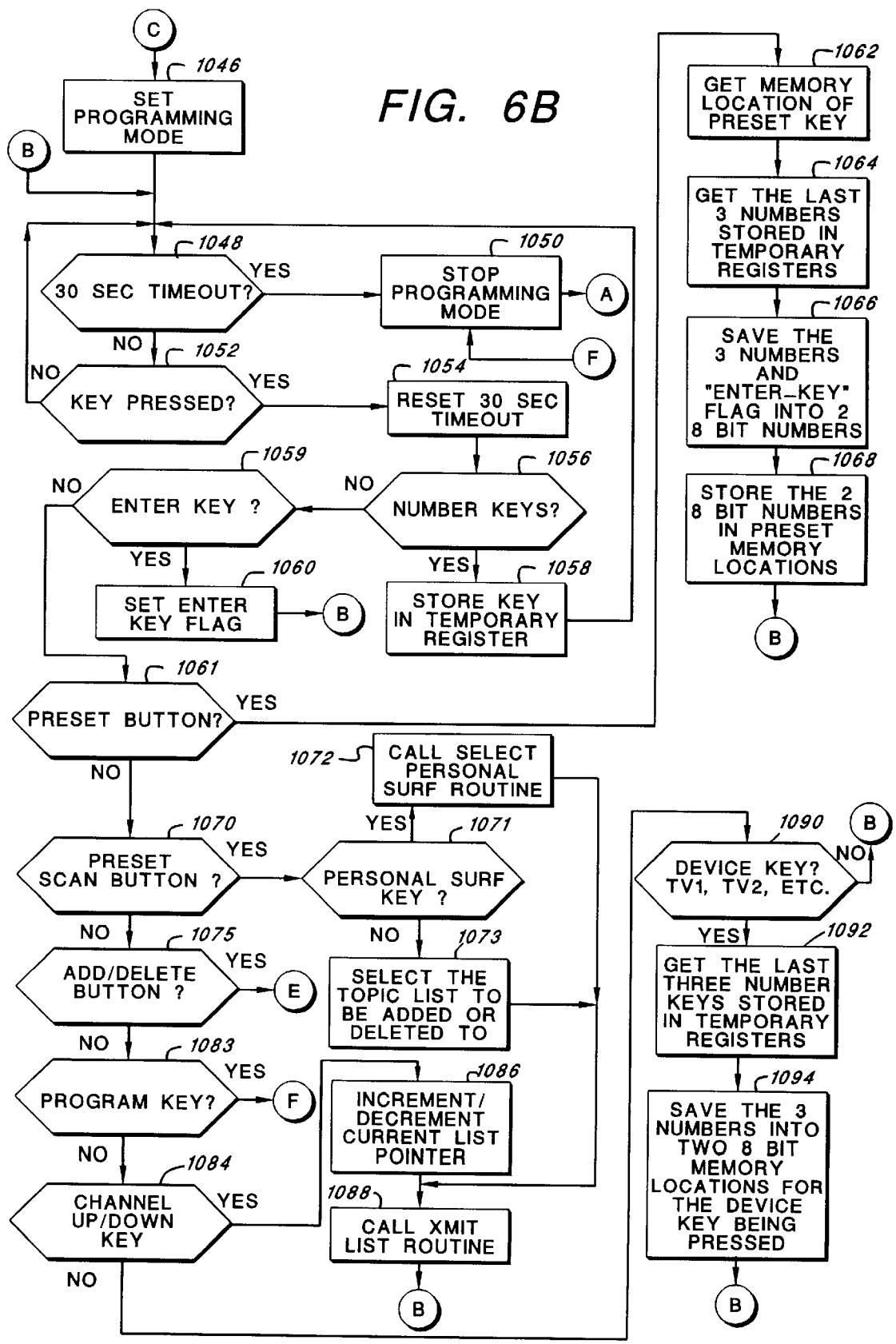
Figure 6C:
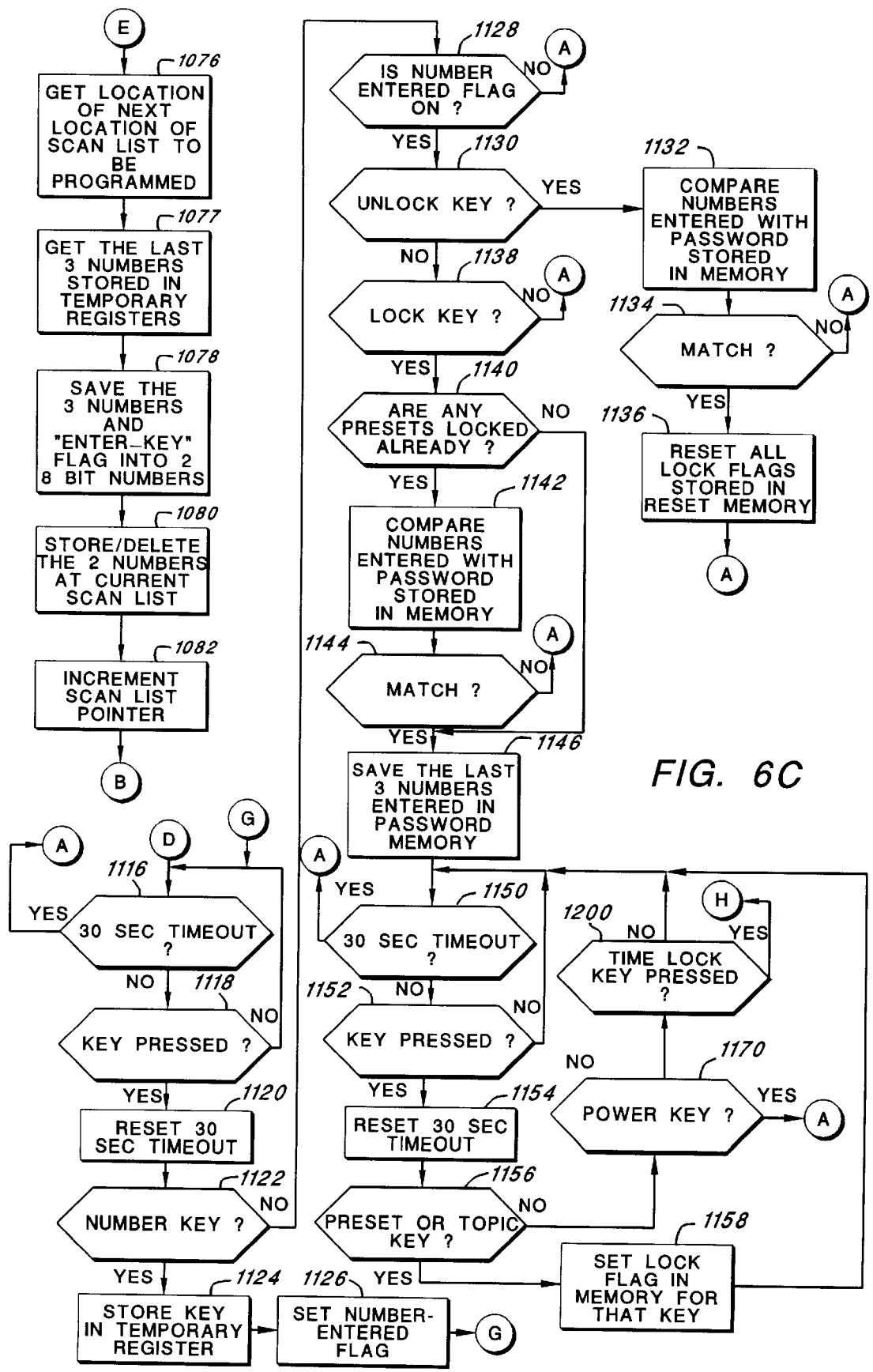
Figure 6D:
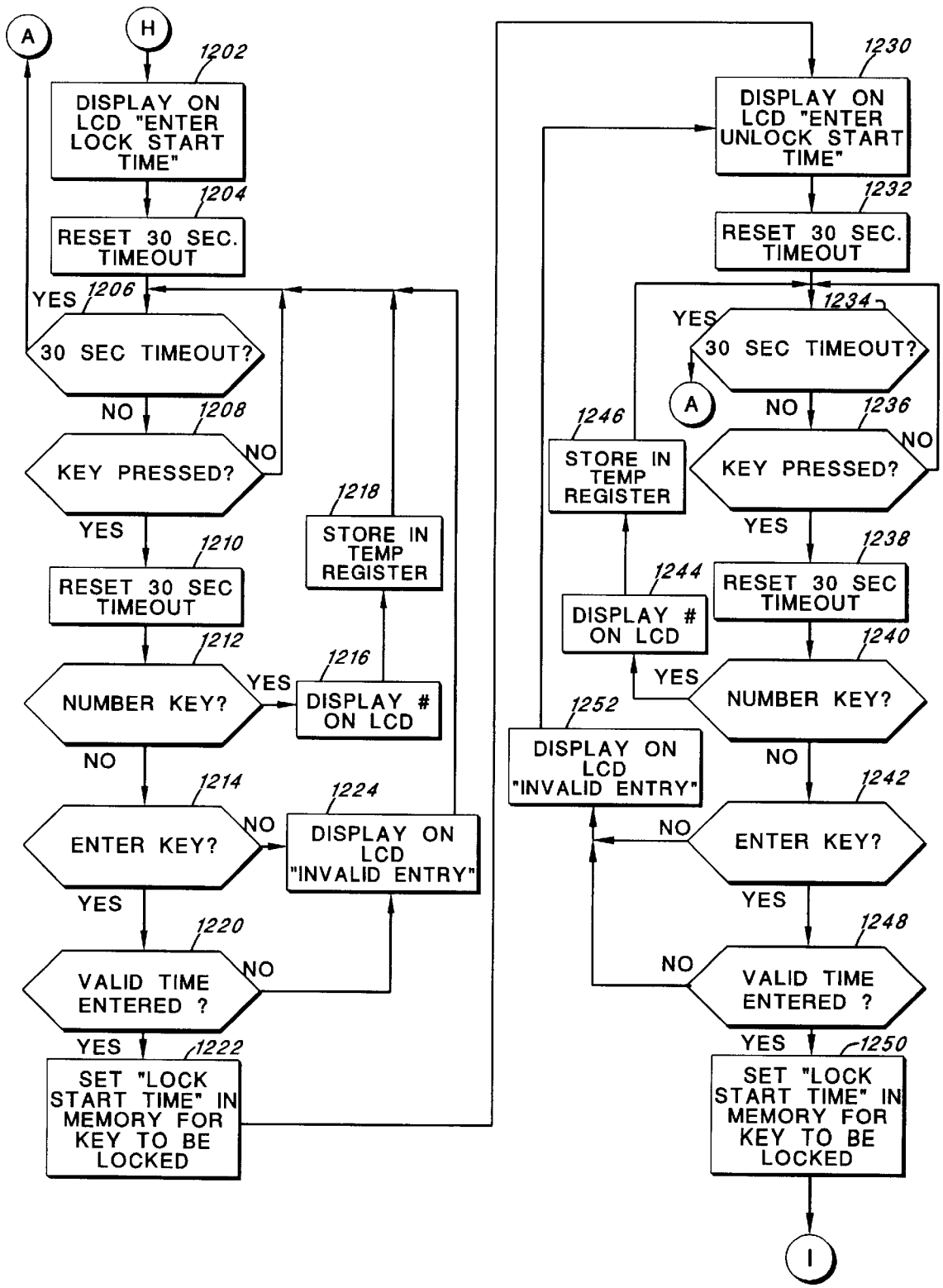
Figure 6E:
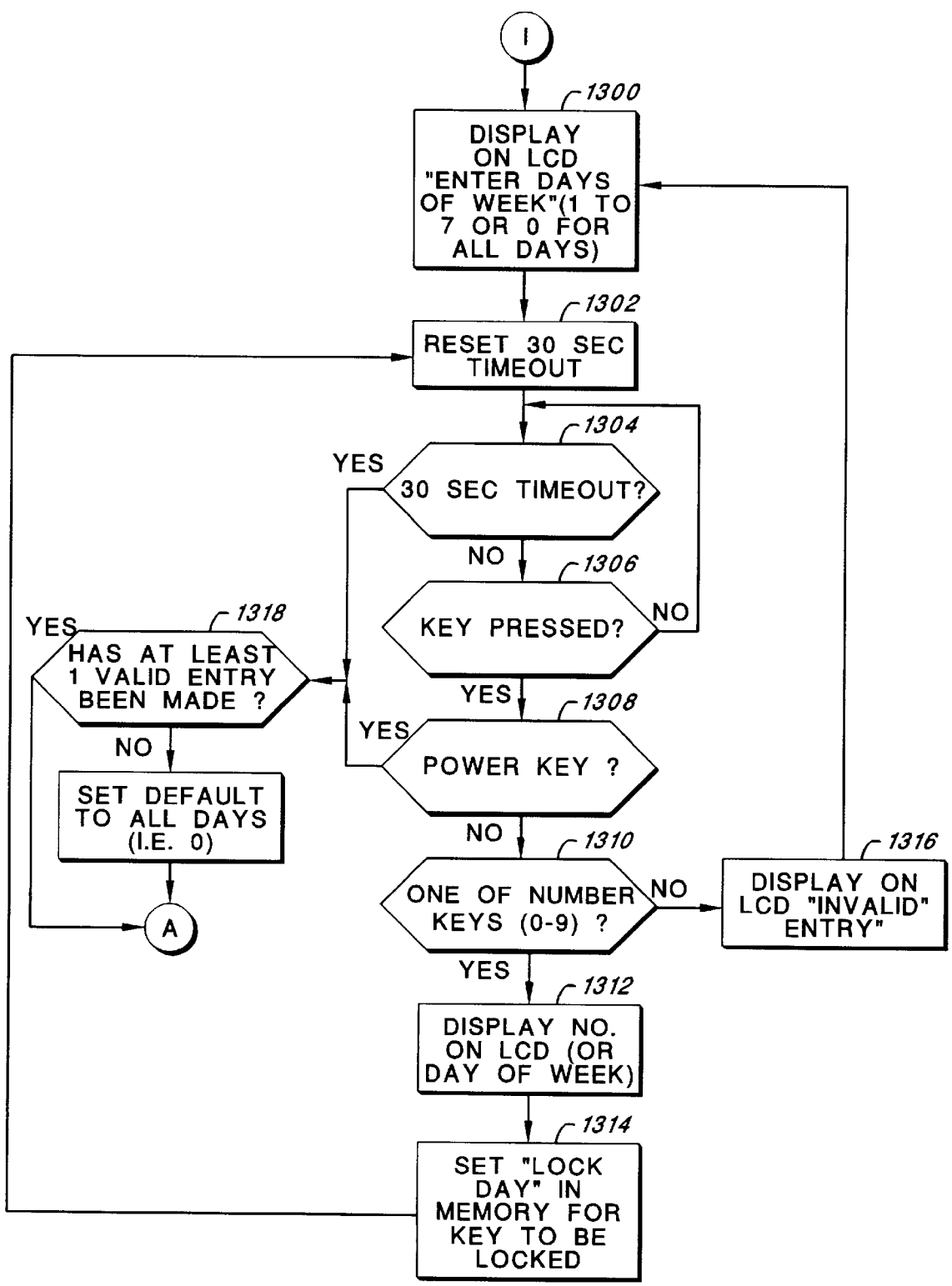

In the event the key depressed is either the add button or the delete button (Block 1075), the next available location within the memory area associated with the preset scan button being programmed, as previously identified (Block 1072 or 1073), is determined (Block 1076, FIG. 6C). The numbers stored in the temporary registers (up to three) within the microcontroller 12 (FIG. 1) are then retrieved (Block 1077), and moved (Block 1078) along with, if appropriate, an enter key flag, into two 8-bit code numbers (using, e.g., a binary coded decimal (BCD) format). The user can indicate to the remote control device that an enter key depression is needed by the controlled device with which the remote control device is being used by depressing the enter key following the depression of the channel number keys of the channel number to be programmed and before depression of the preset scan button to be programmed.

If the add button was depressed, as previously determined (Block 1075), then the two 8-bit code numbers, with or without the enter key flag, are stored within the memory areas associated with the preset scan button being programmed at the next available memory location (Block 1078), as previously determined (Block 1076). A pointer indicating the next available memory location within the memory area associated with the preset scan button being programmed is then incremented (Block 1082). The 30-second time out is then initiated (Block 1048, FIG. 6B) and the remote control device again initiates the 30-second time out period (Block 1048) and awaits the depression of a key on the keypad (Block 1052).

In this way, the above described embodiment provides a remote control device for remotely controlling a controlled device using channel group keys and/or pre-labeled network keys. Advantageously, such embodiment overcomes the above-mentioned shortcomings of the prior art by eliminating the need for a user to know the channel number on which a particular network broadcasts each time he or she wishes to tune the next controlled device to such channel number. Furthermore, the present embodiment eliminates the need for a user, who is looking for a program of a particular type to view, to "surf" through a multiplicity of channel numbers not carrying such particular type of programs in order to "surf" through channel numbers carrying such programs.

If the key depressed was not a channel number key (Block 1056), not the enter key (Block 1059) not a preset button (Block 1061), not a preset scan button (Block 1070), and not the add or delete button (Block 1075), a determination is made (Block 1083) as to whether the key depressed was a program key, i.e., the add key and the delete key depressed simultaneously. If the key depressed was a program key (Block 1083), then the programming mode is stopped (Block 1050), and the microcontroller 12 (FIG. 1) is put to sleep until a key on the keypad 22 (FIG. 1) is depressed (Block 1006, FIG. 6A).

In the event the key depressed is not a channel number key (Block 1056), not a preset button (Block 1061), not a preset scan button (Block 1070), not the add or delete button (Block 1075), and not the program "key" (Block 1083), a determination is made (Block 1084) as to whether the key depressed was a channel up/down button. In the event the key depressed was a channel up/down key (Block 1084), a list pointer, which is stored in the memory, is incremented/decremented (Block 1086), respectively, and the transmit list routine is called (Block 1088) (see FIG. 9). Following execution of the transmit list routine, the 30 second timeout period is initiated (Block 1048) and the microcontroller awaits depression of a key on the keypad (Block 1052).

If the key depressed was not a channel number key (Block 1056), not the enter key (Block 1059), not a preset button (Block 1061), not a preset scan button (Block 1070), not the add or delete button (Block 1075), not the program "key" (Block 1083), and not a channel up/down button (Block 1084), a determination is made (Block 1090) as to whether the key depressed is a device selection key. In the event the key depressed is a device selection key (Block 1090), the last three numbers stored in the temporary registers within the microprocessor are retrieved (Block 1092) and saved (Block 1094) into two 8-bit memory locations within the memory. These two 8-bit memory locations are associated with the device selection key depressed. Following the saving (Block 1094) of the three numbers into the two 8-bit memory location, the 30-second timeout period is again initiated by the microprocessor (Block 1048), and the microprocessor awaits a depression of a key on the keypad (Block 1052).

In the event the key depressed during the 30-second time out period is not a channel number key (Block 1056), not an enter key (Block 1059), not a preset button (Block 1061), not a preset scan button (Block 1070), not the add or delete button (Block 1075), not the program "Key" (Block 1083), not a channel up/down key (Block 1084), and not a device selection key (Block 1090), the key depressed is deemed an invalid key in the programming mode. In response to such an invalid key, the 30 second time out is initiated (Block 1048) and the remote control device again waits until another key is depressed (Block 1052).

In the event the key depressed (Block 1008, 1010, 1012, 1014, back on FIG. 6A, outside of programming mode), is not a direct transmit button (Block 1016), not a preset button (Block 1020), not a preset scan button (Block 1026) and not a program "key" (Block 1044), a determination is made (Block 1096) as to whether the depressed key is device selection key. If the key. depressed is a device selection key (Block 1096), the microcontroller 12 (FIG. 1) scans (Block 1098) an allocation table, in which is stored the memory location of the information set for the controlled device corresponding to the selection key that has been depressed. The microcontroller 12 (FIG. 1) then retrieves (Block 1098) the location for such information set from the allocation table.

Next, the controller retrieves the information set for the controlled device from the memory (Block 1100). This information set determines the transmission "algorithm" used by the microcontroller 12 (FIG. 1) in response to which the coded infrared sequences are generated for transmission to the controlled device. Following retrieval of the information set from the memory, the microcontroller 12 (FIG. 1) is again put to sleep until a key on the keypad is depressed (Block 1006).

In the event the key depressed (Block 1008, 1010 1012, 1014) is not a direct transmission button (Block 1016), not a preset button (Block 1020), not a preset scan button (1026), not a program "key" (Block 1044), and not a controlled device selection key (Block 1096), a determination is made (Block 1102) as to whether the key depressed is a lock/unlock key. In the event the key depressed is a lock/unlock key (Block 1102), the microcontroller (FIG. 1) initiates (Block 1116, FIG. 6C) a 30-second timeout period. If the 30-second timeout period expires (Block 1116) before a key on the keypad is depressed (Block 1118), the microcontroller 12 (FIG. 1) is again put to sleep until a key on the keypad is depressed (Block 1006, FIG. 6A). However, if a key is depressed (Block 1118) before the 30-second timeout period has expired (Block 1116), the 30-second timeout period is reset (Block 1120) and a determination is made (Block 1122) as to whether the key depressed is a channel number key. In the event the key depressed is a channel number key (Block 1122), the number of the channel number key is stored (Block 1124) in a temporary register within the microcontroller and a "number entered" flag is set (Block 1126). Following the setting of the number entered flag, the microccontroller reinitiates (Block 1116) the 30-second timeout period, and waits for a key on the keypad to be depressed (Block 1118).

If, however, the key depressed is not a number key (Block 1122), a determination is made as to whether the "number entered" flag is set (Block 1128). If the "number entered" is set (Block 1128), a determination is then made (Block 1130) as to whether the key depressed is the unlock key. If the key depressed is the unlock key (Block 1130), the numbers stored within the temporary registers of the microcontroller are compared (Block 1132) with a "password" stored in the memory, and if the numbers in the temporary registers match the "password" (Block 1134), lock flags stored within the memory are reset (Block 1136). Note that the "password" and the lock flags are described more fully below. Following resetting of the lock flags (Block 1136), or in the event the numbers in the temporary registers do not match the "password" (Block 1134), the controller is again put to sleep until a key on the keypad is depressed (Block 1006, FIG. 6A).

In the event the key depressed is not the unlock key (Block 1130), a determination is made (Block 1138) as to whether the key depressed is the lock key. If the key depressed is not the lock key (Block 1138), the microcontroller is put to sleep, and again awaits depression of a key on the keypad (Block 1006, FIG. 6A). If, however, the lock key was depressed (Block 1138), a determination is made (Block 1140) as to whether any of the preset buttons have previously been locked. If one or more of the preset buttons have been locked (Block 1140), the numbers stored in the temporary registers of the microcontroller are compared (Block 1142) to the "password" stored in memory. If numbers in the temporary registers do not match the "password" stored in the memory, the microcontroller is put to sleep and awaits depression of a key on the keypad (Block 1006, FIG. 6A).

If, however, the numbers in the temporary registers do match the "password" stored in the memory (Block 1144), or in the event the preset buttons have not already been locked (Block 1140), the last three numbers entered, which are stored in the temporary registers of the microcontroller, are stored (Block 1146) in the memory as a "password". Next, a 30-second timeout period is initiated (Block 1150) and a determination is made as to whether the 30-second timeout period expires (Block 1150) before a key on the keypad is depressed (Block 1152). In the event the 30-second timeout period expires (Block 1150) before a key on the keypad is depressed (Block 1152), the microcontroller is again put to sleep until a key on the keypad is depressed (Block 1006, FIG. 6A).

In the event, however, a key is depressed (Block 1152) before the 30-second timeout expires (Block 1150), the 30-second timeout period is reset (Block 1154), and a determination is made as to whether the key pressed is a preset button (Block 1156), or a preset scan button (Block 1156). In the event the key depressed is a preset button, or a preset scan button (Block 1156), a lock flag is set (Block 1158) within the memory at a location associated with the particular preset button or preset scan button depressed. Following the setting of the lock flag for the particular preset button or preset scan button (Block 1158), the 30 second time out period is again initialed (Block 1150) and the microcontroller waits until a key on the keypad is depressed (Block 1152).

In the event the key depressed is not a preset button or a preset scan button (Block 1156), a determination is then made (Block 1170) as to whether the key depressed is the power key. In the event the button depressed is the power key (Block 1170) and the lock flag for the particular preset button or preset scan button has been set within the memory (Block 1158), subsequent depressions of the particular preset button or preset scan button during operation of the remote control device will be ignored, thus, effectively, "locking out" the channel number or numbers associated with the particular preset button or preset scan button (Block 1156). The microcontroller is then again put to sleep until a key on the keypad is depressed (Block 1006).

If, based on the determinations above as to whether the "number entered" flag is set (Block 1128), whether the unlock key has been depressed (Block 1130) and whether the lock key has been depressed (Block 1138), it is determined that the "number entered" flag is set (Block 1128), the unlock key was not depressed (Block 1130) and the lock key was not depressed (Block 1138), then the microcontroller is again put to sleep until a key on the keypad is depressed (Block 1006, FIG. 6A).

If, following the determinations above as to whether a direct transmission button was depressed (Block 1016, FIG. 6A), whether a preset button was depressed (Block 1020), whether a preset scan button was depressed (Block 1026), whether program "key" was depressed (Block 1044), whether a controlled device selection key was depressed (Block 1096), and whether a lock/unlock key was depressed (Block 1102), a determination is made that a direct transmit button (Block 1016), a preset button (Block 1020), a preset scan button (Block 1026), a program key (Block 1044), a controlled device selection key (Block 1096) and the lock/unlock key (Block 1102) were not depressed, the microprocessor is again put to sleep until a key on the keypad is depressed (Block 1006).

If, based on the determinations above as to whether a lock flag has been set (Block 1158), whether a preset button has been depressed (Block 1156), whether a preset scan button has been depressed (Block 1156), and whether the power key has been depressed (Block 1170), it is determined that a lock flag has been set (Block 1158), and a preset button, a preset scan button, and the power key has not been depressed (Blocks 1156, 1156 and 1170, respectively), a determination is then made as to whether the time lock key has been depressed (Block 1200). In the event it is determined that the time lock key was depressed (Block 1200), the Alphanumeric LCD 30 (FIG. 1) then displays "Enter Lock Start Time" (Block 1202, FIG. 6D) and the 30-second timeout period is reset (Block 1204). If the 30-second timeout period expires (Block 1206) before a key on the keypad is depressed (Block 1208), the microcontroller 12 (FIG. 1) is again put to sleep until a key on the keypad is depressed (Block 1006, FIG. 6A). However, if a key is depressed (Block 1208) before the 30-second timeout period has expired (Block 1116), the 30-second timeout period is reset (Block 1210) and a determination is made as to whether the key depressed is a channel number key (Block 1212). In the event that the key depressed is not a channel number key, a determination is then made as to whether the key depressed is the enter key (Block 1214). In the event that the key depressed is not a channel number key or the enter key, the Alphanumeric LCD displays "Invalid Entry," (Block 1224) followed by "Enter Lock Start Time" (Block 1202). The microcontroller 12 (FIG. 1) then resets the 30-second timeout period (Block 1204) and again waits for the user to depress a key on the keypad or until the 30-second timeout period expires, as described above.

In the event that the key depressed is a channel number key, the number corresponding to the channel number key depressed is displayed on the Alphanumeric LCD (Block 1214) and stored in a temporary register within the microcontroller (Block 1216). The microcontroller then waits for the user to depress another key, as described above.

In the event that the key depressed is the enter key, the microcontroller 12 (FIG. 1) then checks whether a valid time has been entered (Block 1220) by comparing the time entered with a range of valid times stored within the microcontroller 12. In the event it is determined that a valid time has not been entered, (Block 1220) the Alphanumeric LCD displays "Invalid Entry" (Block 1224) followed by "Enter Lock Start Time" (Block 1202); The microcontroller 12 (FIG. 1) then resets the 30-second timeout period (Block 1204) and again waits for the user to depress a key on the keypad or until the 30-second timeout period expires, as described above. In the event that it is determined that a valid time has been entered, the microcontroller 12 (FIG. 1)

will store the numbers entered as the "lock start time" in the EEPROM memory (Block 1222).

After the lock start time has been stored, the Alphanumeric LCD then displays "Enter Unlock Time" (Block 1230). The microcontroller 12 (FIG. 1) then resets the 30-second timeout period (Block 1232). If the 30-second timeout period expires (Block 1234) before a key is depressed (Block 1236), the microcontroller 12 (FIG. 1) is again put to sleep until a key on the keypad is depressed (Block 1006, FIG. 6A). However, if a key is depressed (Block 1236) before the 30-second timeout period has expired (Block 1234), the 30-second timeout period is reset (Block 1238) and a determination is made as to whether the key depressed is a channel number key (Block 1240). In the event that the key depressed is not a channel number key, a determination is made as to whether the key depressed is the enter key (Block 1242). In the event that the key depressed is not a channel number key or the enter key, the Alphanumeric LCD 100 displays "Invalid Entry," (Block 1252) followed by "Enter Unlock Time" (Block 1230). The microcontroller 12 (FIG. 1) then resets the 30-second timeout period (Block 1232) and again waits for the user to depress a key on the keypad or until the 30-second timeout period expires, as described above.

In the event that the key depressed is a channel number key, the number corresponding to the channel number key depressed is displayed on the Alphanumeric LCD (Block 1244) and stored in a temporary register (Block 1246) within the microcontroller. The microcontroller then waits for the user to depress another key or until the 30-second timeout period expires, as described above.

In the event that the key depressed is the enter key, the microcontroller 12 (FIG. 1) then checks whether a valid time has been entered (Block 1248) by comparing the time entered with a range of valid times stored in the microcontroller 12. In the event it is determined that a valid time has not been entered (Block 1248) the Alphanumeric LCD will display "Invalid Entry" (Block 1252) followed by "Enter Unlock Time" (Block 1230). The microcontroller 12 (FIG. 1) will then reset the 30-second timeout period (Block 1232) and again wait for the user to depress a key on the keypad or until the 30-second timeout period expires, as described above. In the event that it is determined that a valid time has been entered, the microcontroller 12 (FIG. 1) will store the numbers entered as the "unlock time" in memory (Block 1250).

In a preferred variation, after the "unlock time" has been set (Block 1250), the Alphanumeric LCD displays "Enter Days of Week" at which point the user may depress a channel number key numbered zero through seven with one through seven corresponding to the seven days of the week and zero corresponding to all the days of the week. The microcontroller 12 (FIG. 1) then resets the 30-second timeout period (Block 1302). If the 30-second timeout period expires (Block 1304) before a key is depressed (Block 1306), a determination is made as to whether at least one valid "day entry", i.e., channel number key numbered zero through seven, has been made (Block 1318). If it is determined that at least one valid day entry has not been made (Block 1318), the microcontroller 12 (FIG. 1) sets a default value to all days of the week (Block 1320) and the selected key(s) are locked-out for all days of the week at the designated times as determined by the lock start time and unlock time as entered above. The microcontroller 12 is then put to sleep until a key on the keypad is depressed (Block 1006, FIG. 6A). If it is determined that at least one valid day entry has been made (Block 1318), subsequent depressions of the particular preset button or preset scan button will be ignored during operation of the remote control device during the lock-out time period on the day(s) of the week specified. The microcontroller 12 is then put to sleep until a key on the keypad is depressed (Block 1006, FIG. 6A).

However, if a key is depressed (Block 1306) before the 30-second timeout period has expired (Block 1304), a determination is made as to whether the key depressed is the power key 68 (FIG. 4) (Block 1240). In the event that the key depressed is not the power key 68, a determination is then made as to whether the key depressed is one of the channel number keys labeled zero through seven (Block 1310). In the event that the key depressed is not the power key 68 and not one of the channel number keys labeled zero through seven, the Alphanumeric LCD will display "Invalid Entry," (Block 1316) followed by "Enter Days of Week" (Block 1300). The microcontroller 12 (FIG. 1) will then reset the 30-second timeout period (Block 1302) and again wait for the user to depress a key on the keypad (Block 1236) or until the 30-second timeout period expires (Block 1234), as described above.

In the event that the key depressed is a number key, the LCD Alphanumeric Display will display the number of the number key depressed (Block 1312) and the microcontroller 12 (FIG. 1) will set a "lock day" in memory for the day of the week corresponding to the number key pressed (Block 1314) e.g., one for Sunday, two for Monday, three for Tuesday, etc. Once the lock day has been stored in memory, subsequent depressions of the particular preset buttons or preset scan buttons will be ignored during operation of the remote control device during the lock-out time period and day(s) of the week specified. The microcontroller 12 then resets the 30-second timeout period (Block 1302) and waits for the user to depress another key on the keypad or until the 30-second timeout period expires, as described above.

In the event that the key depressed is the power key 68, the microcontroller 12 (FIG. 1) then checks whether at least one valid lock day entry has been made (Block 1318). If it is determined that at least one valid lock day entry has not been made (Block 1318), the microcontroller 12 (FIG. 1) sets the default value to all days of the week (Block 1320) and the particular preset buttons or preset scan buttons will be locked-out for all days of the week at the designated times, as determined by the lock start time and unlock time as stored above.

If it is determined that at least one valid day entry has been made (Block 1318), subsequent depressions of the particular preset buttons or preset scan buttons will be ignored during operation of the remote control device during the lock-out time period and lock day(s) specified. Following the storing of the "lock-out" times and day(s), as described above, the microcontroller 12 is then put to sleep until a key on the keypad is depressed.

If the key depressed is not the preset button or the preset scan button (1156, FIG. 6C) and is not the power key (Block 1170) or the time lock key (Block 1200), the 30-second timeout period is restarted (Block 1150), and the microcontroller waits until either the 30-second timeout period expires (Block 1150), or until a key on the keypad is depressed (block 1152), as above.

Referring next to FIG. 7, a flow diagram is shown of a transmit routine used when the transmission of a coded infrared signal is called for by the control program of FIG. 6 (see Block 1018), or by the preset transmit routine of FIG. 8 (see Block 1008), described below. When the transmit routine is called by the control program (Block 2000), information from the information set for the particular controlled device relating to the coded infrared sequence to be transmitted is retrieved (Block 2002) from the appropriate information set within the EEPROM 14 (FIG. 1). In response to retrieval of such information, electrical signals are generated (Block 2004) within the microcontroller 12 (FIG. 1) in response to which the infrared emitter 20 (FIG. 1) emits the desired coded infrared sequence. A determination is then made as to whether the key in response to which the coded infrared sequence is being transmitted is still being depressed (Block 2006), and if it is (Block 2006), the microcontroller 12 (FIG. 1) continues to generate the electrical signals in response to which the coded infrared sequence is generated (Block 2004). When the key ceases to be depressed (Block 2006), the transmit routine returns control (Block 2008) to the control program of FIG. 6 or to the preset transmit routine of FIG. 8, as appropriate.

Referring next to FIG. 8, a flow diagram is shown of a transmit preset routine that is called by the control routine of FIG. 6 and by a transmit list routine of FIG. 9. Upon being called (Block 3000) the transmit preset routine retrieves (Block 3002) the two 8-bit code numbers associated with the preset button in response to which the preset routine has been called from the EEPROM 14 (FIG. 1). The two 8-bit code numbers are separated (Block 3004) into constituent digits and the enter key flag, if the enter key flag is set within one of the two 8-bit code numbers (Block 3004), i.e., if required by the controlled device being controlled. The digits retrieved from the 8-bit coded numbers are two or three digits of a channel number to be transmitted to the controlled device. If a third number is also retrieved, it is transmitted in a similar manner. The first number is retrieved (Block 3006), electrical signals are generated by the microcontroller 12 (FIG. 1), and an appropriate coded infrared sequence is transmitted by the infrared emitter 20 (FIG. 1) to the controlled device 26 (FIG. 1) in accordance with the transmit routine of FIG. 7 (Block 3008). Next, the second number is retrieved (Block 3010) and transmitted (Block 3012) using the transmit routine. If a third number is also retrieved, it is transmitted in a similar manner. If the enter key flag is set within one or more of the 8-bit code numbers (Block 3014), then information to be transmitted in response to the enter key is retrieved from the information set for the controlled device (Block 3016) and is then transmitted using the transmit routine of FIG. 7 (Block 3018). Following the transmission of the coded infrared sequence for the enter key, or if no enter key is required by the controlled device, control is returned to the control routine of FIG. 6 (Block 3020).

Referring to FIG. 9, a flow diagram is shown of a transmit list routine that is called by the control routine of FIG. 6. Initially, the channel up/down keys 56, 58 are associated (Block 4030) with a software routine for directing the remote control device to transmit coded infrared sequences for sequentially tuning the controlled device to a next or a previous channel number within the current channel group. This allows the user to step through the channels of a channel group in a forward or reverse direction using the channel up/down keys. This forward or reverse scanning is achieved by incrementing or decrementing a list pointer within the current channel group. Next, the list pointer is retrieved (Block 4031) from the EEPROM 14 (FIG. 1). The list pointer points to a channel number within the retrieved channel group to be selected next. Information for the channel number to which the list pointer points is then retrieved (Block 4032) from the EEPROM 14 (FIG. 1), and the transmit preset routine of FIG. 8 is called (Block 4034).

In response to the transmit preset routine, electrical signals are generated by the microcontroller 12 (FIG. 1). These electrical signals cause the infrared emitter 20 (FIG. 1) to emit coded infrared sequences that instruct the controlled device 26 (FIG. 1) to tune (Block 4034) to the channel number pointed to in the channel group by the list pointer.

Following a two and one-half second delay (Block 4036), a determination is made as to whether the preset scan button is still being depressed (Block 4038). If the preset scan button is not being depressed (Block 4038), a determination is made (Block 4039) as to whether the channel down key is being depressed. If the channel down key is not being depressed, control is returned to the control program of FIG. 6.

If the preset scan button is still being depressed (Block 4038), the list pointer is incremented to the next channel number in the channel group (Block 4040), and information needed by the microcontroller 12 (FIG. 1) to generate electrical signals for the next channel number is retrieved (Block 4042) from the EEPROM 14 (FIG. 1). If the channel down key is being depressed (Block 4039), the list pointer is decremented to the previous channel number in the channel group (Block 4043), and information needed by the microcontroller 12 (FIG. 1) to generate electrical signals for the previous channel number is retrieved (Block 4042) from the EEPROM 14 (FIG. 1). In response to the retrieval of the information (either for the next channel number of the previous channel number), the transmit preset routine is again called (Block 4034) and the microcontroller 12 (FIG. 1) generates the electrical signals, which cause the infrared emitter 20 (FIG. 1) to emit a coded infrared sequence instructing the controlled device 26 (FIG. 1) to tune to the channel number indicated by the list pointer. Following generation of the electrical signals and the coded infrared sequence, the microcontroller 12 (FIG. 1) again waits for two and one-half seconds (Block 4036) and determines whether the preset scan button continues to be depressed (Block 4038) or the channel down key has been depressed (Block 4039), as described above. If the preset scan button and the channel down key are not being depressed, the control is returned (Block 4050) to the control program of FIG. 6.

Figure 10:
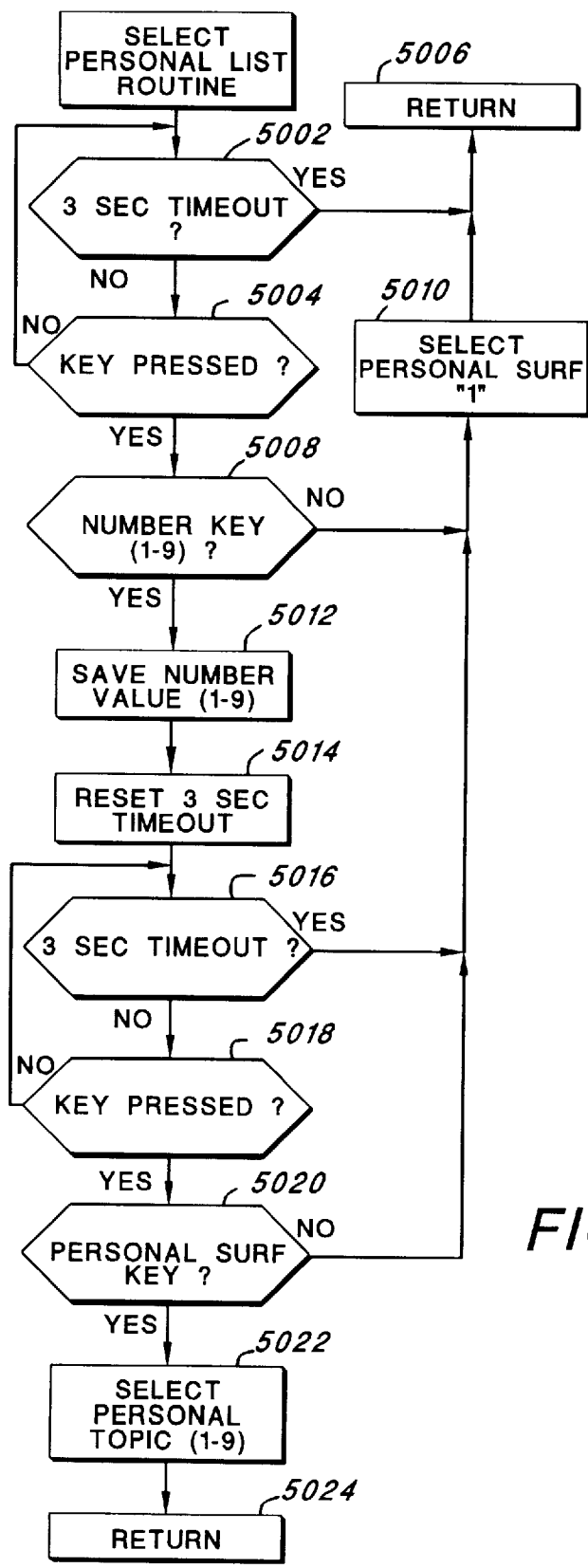
FIG. 10 is a flow diagram of the steps traversed in a select personal list routine that is called by the control program of FIG. 6.

Referring next to FIG. 10, a flow diagram is shown of the steps traversed in a select personal list routine that is called by the control program of FIG. 6. Initially, a 3-second timeout period is initiated (Block 5000). If the 3-second timeout period expires (Block 5002), before a key is depressed (Block 5004), control is returned (Block 5006) to the control program of FIG. 6. If a key is depressed (Block 5004), however, before the 3-second timeout has expired (Block 5002) a determination is made as to whether a channel number key, having a magnitude of 1–9 has been depressed (Block 5008). If a channel number key having a magnitude of 1–9 has not been depressed, the "personal surf" number is reset to 1 (Block 5010), and control is returned (Block 5006) to the control routine of FIG. 6.

If, however, a channel number key having a magnitude of 1–9 is depressed (Block 5008), the magnitude of such channel number key is stored within the EEPROM (Block 5012), and the 3-second timeout period is reset (Block 5014). If the 3-second timeout period expires (Block 5016) before a key on the keypad is depressed (Block 5018), the "personal surf" number is reset to 1 (Block 5010) and control is returned (Block 5006) to the control routine of FIG. 6.

If, however, a key is depressed (Block 5018) before the 3-second timeout period expires (Block 5016), a determination is made (Block 5020) as to whether the "personal surf" key has been depressed. If the personal surf key was not the key depressed (Block 5020), the "personal surf" number is reset to 1 (Block 5010), and control is returned (Block 5006) to the control routine of FIG. 6. If, however, the key depressed was the personal surf key (Block 5020), a personal channel group corresponding to the channel number key, 1–9, is selected (Block 5022) and control is returned (Block 5024) to the control routine of FIG. 6.

Figure 11:
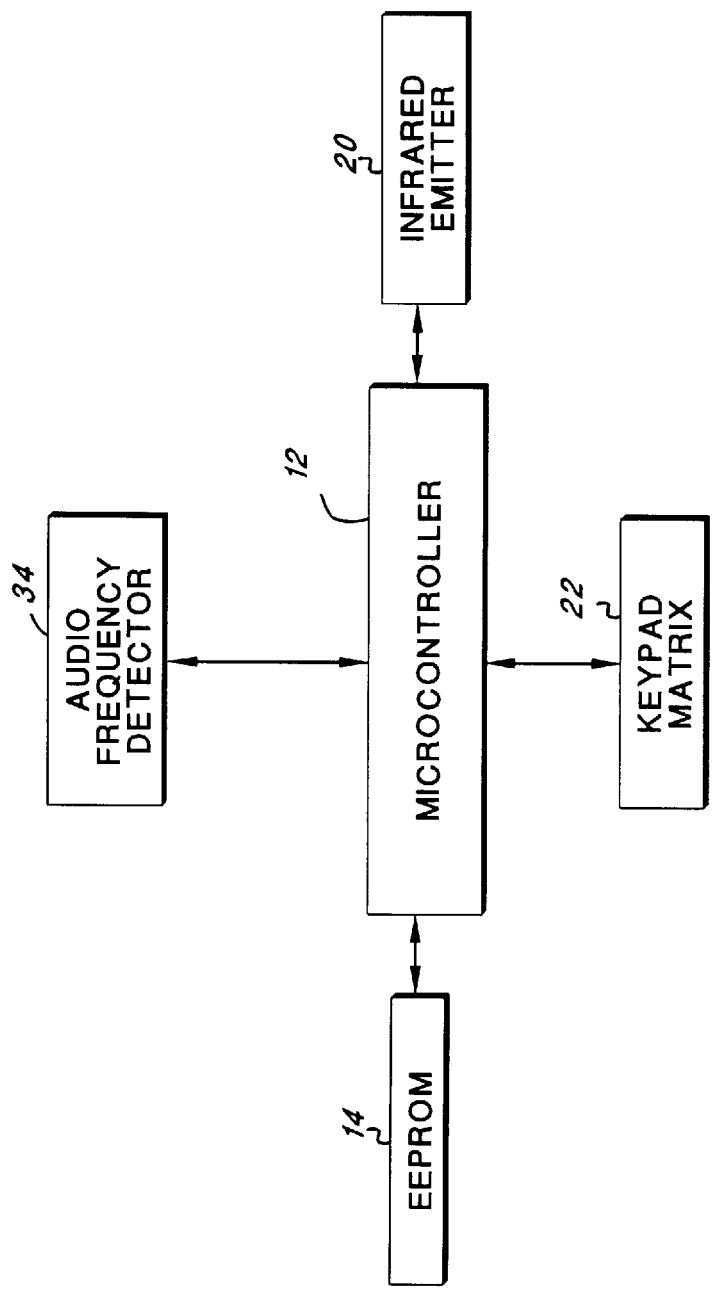
FIG. 11 is a block diagram showing a variation of the remote control device including a low frequency detector and an audio signal generator.

Referring next to FIG. 11, a block diagram is shown illustrating a variation of the remote control device 10 of the present embodiment. The remote control device 10 of FIG. 11 has a microcontroller 12 coupled to an electronically erasable programmable read only memory (EEPROM) 14, an infrared emitter 20, a keypad matrix 22, a frequency detector 34, and an audio signal generator 36, coupled to the frequency detector 34. This remote control device 10 allows the user to locate it by producing an audio signal to guide the user to its location. Advantageously, this allows the user to locate the remote control device 10 when he/she has misplaced it. The frequency detector 34 detects sounds preferably in an audio frequency range (e.g., about 20 Hz to about 30 kHz responsive to either a whistle, a clap of the hands, or similar noise. It may, however in some embodiments, be advantageous to instead or in addition detect sounds outside the audio frequency range, e.g., in ultrasonic or infrasonic ranges. When a user desires to locate the remote control device 10 (FIG. 11), he or she can make a clapping noise or a whistle noise, and the frequency detector 34 will detect the soundwave produced by the user. The frequency detector 34 is a circuit that includes a bandpass filter to filter out any signals not within a prescribed frequency range, which is preferably the audio frequency range selected to contain frequencies generated by, for example, clapping and/or whistling. The frequency detector 34 also includes a measuring circuit which measures signals output from the bandpass filter and compares the voltage levels of these signals to a reference level. If the voltage level of the measured signals is greater than the reference level, the frequency detector 34 produces a signal that instructs the audio signal generator 36 to generate an audio locator signal. The audio signal generator is a custom designed circuit that generates certain sounds, e.g., an audible "beep" tone, using a power amplifier and a Piezo element, such as is well known in the art. In response to the audio locator signal, which is preferably the audible "beep" tone, the user is guided to the location of the remote control device.

While the invention herein disclosed has been described by means of specific embodiments and applications thereof, numerous modifications and variations could be made thereto by those skilled in the art without departing from the scope of the invention set forth in the claims.

What is claimed is:

1. A remote control device for controlling an electronic device, the remote control device comprising:

a keypad including a time-lock key and another key;

a processor, coupled to the keypad, including means for locking the other key for a prescribed time period in response to a depression of the time-lock key;

a transmitter for transmitting a channel select signal in response to a depression of the other key when the other key is not locked;

a memory, coupled to said processor, for storing a start time and an end time of said prescribed time period; and a timer, coupled to said processor, for monitoring time and for providing timing information to said processor;

said processor further including means for receiving a start time signal and an end time signal from said keypad and for setting said prescribed time period in response to the start time signal and the end time signal.

2. The remote control device of claim 1 wherein:

said processor further includes means for receiving a day signal from said keypad and for setting a day of the week on which said other key is to be locked during said prescribed time period in response to the day signal;

said memory further includes means for storing the day of the week; and said timer further includes means for monitoring a day of the week.

3. The remote control device of claim 1 wherein said memory comprises an electronically erasable programmable read only memory (EEPROM).

4. The remote control device of claim 1 wherein said processor comprises a microcontroller.

5. The remote control device of claim 1 further comprising means for displaying information/instruction signals to a user during operation and programming of said remote control device.

6. The remote control device of claim 5 wherein said means for displaying information/instruction signals comprises:

a liquid crystal display controller, coupled to said processor, for receiving processor signals from said processor and for sending control signals to a liquid crystal display; and the liquid crystal display, coupled to said liquid crystal display controller, for receiving the control signals from the liquid crystal display controller and for displaying the information/instruction signals to a user.

7. The remote control device of claim 1 wherein said transmitter includes an infrared transmitter.

8. The remote control device of claim 1 further comprising:

a frequency detector for detecting soundwaves; and an audio signal generator, coupled to said frequency detector, for emitting an audio signal in response to said detecting of said soundwaves.

9. A remote control device for controlling an electronic device, the remote control device comprising:

a keypad including a time-lock key and another key;

a processor, coupled to the keypad, including means for locking the other key for a prescribed time period in response to a depression of the time-lock key; and a transmitter for transmitting a channel select signal in response to a depression of the other key when the other key is not locked;

wherein said keypad further includes a lock key; and wherein said processor further includes means for locking said other key in response to a depression of the lock key.

10. The remote control device of claim 9 wherein:

said keypad further includes an unlock key; and said processor further includes means for unlocking said other key in response to a depression of the unlock key.

11. The remote control device of claim 10 wherein:

said keypad further includes a numeric key; and said processor further includes means for unlocking said other key only in response to a depression of said unlock key and a depression of the numeric key.

12. The remote control device of claim 11 wherein:

said processor further includes means for locking said other key only in response to a depression of said lock key and a depression of said numeric key.

13. A remote control device for controlling an electronic device comprising:

a keypad including a first key;

a memory for storing information associated with the first key;

a processor, coupled to the keypad and the memory, the processor including means for retrieving the information associated with the first key from the memory and for generating electrical signals in response to the information upon depression of the first key;

a transmitter, coupled to said processor, for transmitting a transmit signal in response to the electrical signals;

an audio frequency detector for detecting audio frequency soundwaves;

an audio signal generator, coupled to said audio frequency detector, for emitting an audio signal in response to said audio frequency soundwaves; and a housing coupled to the keypad, the memory, the processor, the transmitter, the frequency detector and the audio signal generator;

wherein said keypad further includes the time-lock key;

wherein said processor further includes means for locking said first key for a prescribed period of time in response to depression of said time-lock key; and wherein said processor further includes means for locking said first key on a prescribed day of the week for said prescribed period of time.

14. The remote control device of claim 13 further comprising a means for displaying information/instruction signals to a user during operation and programming of said remote control device.

15. A method of locking a first key on a remote control device, said method comprising the steps of:

detecting a depression of a lock key on a keypad of the remote control device;

entering a user password;

selecting the first key;

pressing a time-lock key on the keypad;

entering a start time of a time period during which the first key is to be locked; and entering an end time of the time period during which the first key is to be locked.

16. A method of locking a first key on a remote control device, the method comprising the steps of:

pressing a time-lock key on a keypad of the remote control device;

entering a user password;

selecting the first key;

entering, via the keypad, a start time of a time period during which the first key is to be locked; and entering, via the keypad, an end time of the time period during which the first key is to be locked.

17. A method of transmitting control signals from a remote control device to an electronic device to be controlled, said method comprising the steps of:

detecting a depression of a key on a keypad;

determining if the key depressed is a preset channel key;

determining, if the key depressed is a preset channel key, whether the key has been locked;

determining, if the key depressed is locked, a prescribed time period in which the key is set to be locked;

determining a present time of day;

determining whether the present time of day falls within the prescribed time period; and transmitting a control signal associated with the key to the electronic device to be controlled in the event that the present time of day does not fall within the prescribed time period.

18. The method of claim 17 further comprising the step of:

not transmitting a control signal associated with the key to the electronic device to be controlled in the event that the present time of day does fall within the prescribed time period.

* * * * *